(12) United States Patent
    Song

(10) Patent No.: US 12,676,532 B2
(45) Date of Patent: Jul. 7, 2026

(54) DISPLAY DEVICE

(71) Applicant: LG ELECTRONICS INC., Seoul (KR)

(72) Inventor: Insu Song, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 77 days.

(21) Appl. No.: 18/869,486

(22) PCT Filed: May 27, 2022

(86) PCT No.: PCT/KR2022/007563
    § 371 (c)(1),
    (2) Date: Nov. 26, 2024

(87) PCT Pub. No.: WO2023/229074
    PCT Pub. Date: Nov. 30, 2023

(65) Prior Publication Data
    US 2025/0317027 A1     Oct. 9, 2025

(51) Int. Cl.
    *H02K 7/116*     (2006.01)
    *F16H 25/20*     (2006.01)
    *H05K 5/02*     (2006.01)
(52) U.S. Cl.
    CPC ........... *H02K 7/1166* (2013.01); *F16H 25/20* (2013.01); *H05K 5/0217* (2013.01); *F16H 2025/2084* (2013.01); *F16H 2025/209* (2013.01)
(58) Field of Classification Search
    None
    See application file for complete search history.

(56) References Cited

U.S. PATENT DOCUMENTS

| | | | | |
|---|---|---|---|---|
| 2014/0376163 A1* | 12/2014 | Song | ...................... | G09F 9/301 |
| | | | | 361/679.01 |
| 2015/0145837 A1* | 5/2015 | Park | ................. | H04N 21/41265 |
| | | | | 345/184 |
| 2017/0124937 A1* | 5/2017 | Kim | ..................... | G09G 3/2096 |

FOREIGN PATENT DOCUMENTS

| | | |
|---|---|---|
| JP | 5947366 B2 | 7/2016 |
| KR | 10-2015-0136429 A | 12/2015 |
| KR | 10-1749713 B1 | 7/2017 |
| KR | 10-2019-0092966 A | 8/2019 |
| KR | 10-2193921 B1 | 12/2020 |
| KR | 10-2265333 B1 | 6/2021 |

* cited by examiner

*Primary Examiner* — James Wu
*Assistant Examiner* — Christopher L Augustin
(74) *Attorney, Agent, or Firm* — Birch, Stewart, Kolasch & Birch, LLP

(57)     ABSTRACT

Disclosed is a display device. This display device may comprise: a flexible display panel; a flexible plate which is positioned on the rear side of the display panel and to which the display panel is coupled; a driving module positioned on the rear side of the plate and having a flip frame that reciprocates in a straight line; a wing which is elongated, has one end coupled to the flip frame and the other end coupled to the rear side of the plate, and has a pivot axis positioned to be adjacent to the one end between the one end and the other end; and a wing bracket to which the pivot axis is connected and which is fixed to the rear side of the plate.

14 Claims, 29 Drawing Sheets

DISPLAY DEVICE

CROSS REFERENCE TO RELATED APPLICATIONS

This application is the National Phase of PCT/KR2022/007563 filed on May 27, 2022, which is hereby expressly incorporated by reference into the present application.

TECHNICAL FIELD

The present disclosure relates to a display device. More particularly, the present disclosure relates to a display device capable of changing a curvature of a display panel.

BACKGROUND ART

With the development of information society, there has been a growing demand for various types of display devices. In order to meet such demand, various display devices, such as a liquid crystal display (LCD), an electro luminescent display (ELD), a vacuum fluorescent display (VFD), an organic light emitting diode (OLED) display, and the like, have been developed and used.

An OLED panel can display an image by depositing an organic layer capable of emitting light on a substrate on which a transparent electrode is formed. OLED panels are not only thin, but also have flexible properties. Research has been actively conducted on the structural characteristics of a display device having such an OLED panel.

DISCLOSURE

Technical Problem

It is an objective of the present disclosure to solve the above and other problems. It is another objective of the present disclosure to provide a structure that allows the curvature of a display panel to be freely changed.

It is yet another objective of the present disclosure to provide a mechanism that allows the curvature of a display to be freely changed.

Technical Solution

According to one aspect of the subject matter described in this application, a display device includes: a flexible display panel; a flexible plate positioned at a rear of the display panel and to which the display panel is coupled; a driving module positioned at a rear of the plate and including a flip frame configured to linearly reciprocate; a wing elongated with a first end coupled to the flip frame and a second end coupled to the rear of the plate, the wing including a pivot shaft disposed adjacent to the first end between the first end and the second end; and a wing bracket to which the pivot shaft is connected, the wing bracket being fixed to the rear of the plate, wherein the driving module includes: a lead screw configured to be rotatable; a driving gear fixed to the lead screw so as to rotate together with the lead screw; a motor configured to provide torque; a gear box configured to transmit the torque provided by the motor to the driving gear; and a moving block configured to move on the lead screw by rotation of the lead screw, and wherein the flip frame has a first side fixed to the wing and a second side pivotably connected to the moving block.

Advantageous Effects

According to at least one of the embodiments of the present disclosure, it is possible to provide a structure that allows the curvature of a display panel to be freely changed.

According to at least one of the embodiments of the present disclosure, it is possible to provide a mechanism that allows the curvature of a display to be freely changed.

Further scope of applicability of the present disclosure will become apparent from the following detailed description. However, it should be understood that the detailed description and specific embodiments such as preferred embodiments of the present disclosure are given by way of example only, since various changes and modifications within the idea and scope of the present disclosure may be clearly understood by those skilled in the art.

BRIEF DESCRIPTION OF DRAWINGS

FIGS. 1 to 29 are diagrams illustrating examples of a display device according to embodiments of the present disclosure.

MODE FOR THE INVENTION

Figure 1:
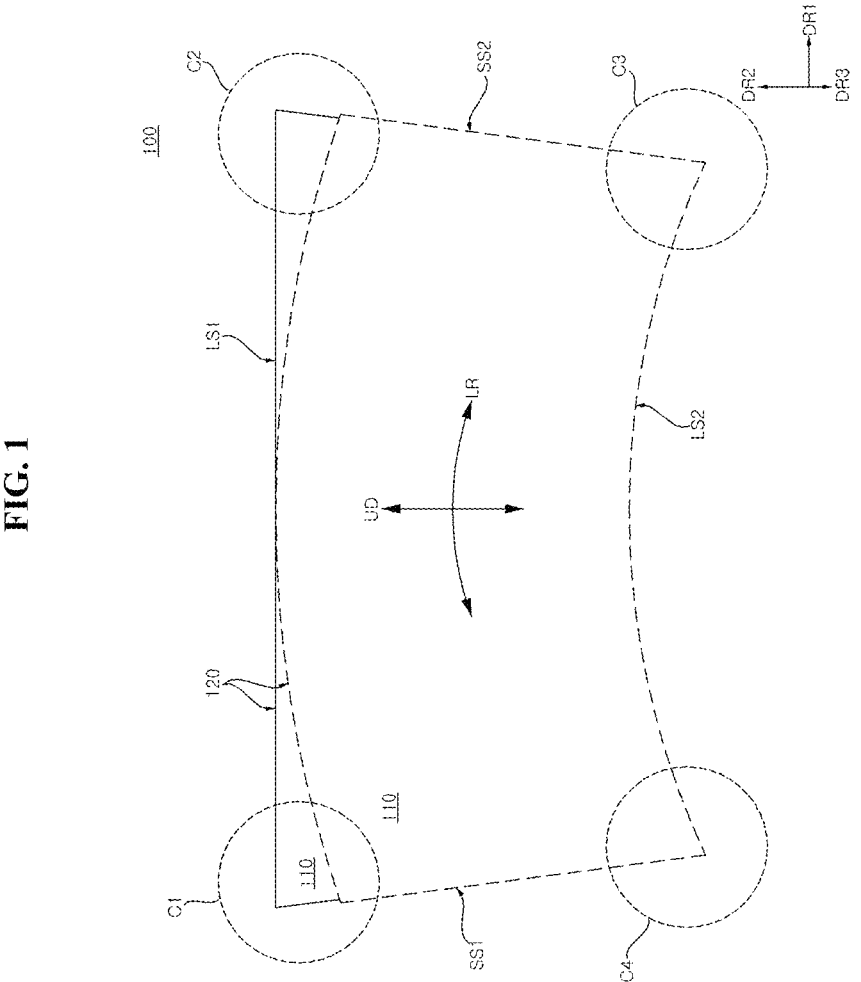

Description will now be given in detail according to exemplary embodiments disclosed herein, with reference to the accompanying drawings. For the sake of brief description with reference to the drawings, the same or equivalent components may be denoted by the same reference numbers, and description thereof will not be repeated.

In the following description, a suffix such as "module" and "unit" may be used to refer to elements or components. Use of such a suffix herein is merely intended to facilitate description of the specification, and the suffix itself is not intended to give any special meaning or function. In the present disclosure, that which is well known to one of ordinary skill in the relevant art has generally been omitted for the sake of brevity. The accompanying drawings are used to help easily understand the technical idea of the present disclosure and it should be understood that the idea of the present disclosure is not limited by the accompanying drawings. The idea of the present disclosure should be construed to extend to any alterations, equivalents, and substitutes besides the accompanying drawings.

Although the terms "first", "second", etc. may be used herein to describe various elements, these elements should not be limited by these terms. These terms are only used to distinguish one element from another.

It will be understood that when a component is referred to as being "connected to" or "coupled to" another component, it may be directly connected to or coupled to another component, or intervening components may be present. In contrast, when a component is referred to as being "directly connected to" or "directly coupled to" another component, there are no intervening components present.

As used herein, a singular representation is intended to include a plural representation unless the context clearly indicates otherwise.

It will be further understood that the terms "comprises or includes" and/or "has" when used in this specification, specify the presence of a stated feature, number, step, operation, component, element, or combination thereof, but do not preclude the presence or addition of one or more other features, numbers, steps, operations, components, elements, or combinations thereof.

Hereinafter, a display panel will be described using an organic light emitting diode (OLED) panel as an example, but the display panel applicable to the present disclosure is not limited to the OLED panel.

In the following description, a display device may include a first long side LS1, a second long side LS2 opposite the first long side LS1, a first short side SS1 adjacent to one end of the first long side LS1 and one end of the second long side LS2, and a second short side SS2 opposite the first short side SS1.

Here, an area of the first short side SS1 may be referred to as a first side area; an area of the second short side SS2 may be referred to as a second side area opposite the first side area; an area of the first long side LS1 may be referred to as a third side area that is adjacent to the first side area and the second side area and positioned between the first side area and the second side area; and an area of the second long side LS2 may be referred to as a fourth side area that is adjacent to the first side area and the second side area, positioned between the first side area and the second side area, and opposite the third side area.

For ease of explanation, it is illustrated and described that lengths of the first and second long sides LS1 and LS2 are greater than lengths of the first and second short sides SS1 and SS2. However, the lengths of the first and second long sides LS1 and LS2 may be substantially equal to the lengths of the first and second short sides SS1 and SS2.

Herein, a first direction DR1 may be a direction parallel to the long sides LS1 and LS2 of the display device, and a second direction DR2 may be a direction parallel to the short sides SS1 and SS2 of the display device. A third direction DR3 may be a direction perpendicular to the first direction DR1 and/or the second direction DR2.

The first direction DR1 and the second direction DR2 may be collectively referred to as a horizontal direction. The third direction DR3 may be referred to as a vertical direction.

A side or a surface on which the display device displays an image may be referred to as a front side or a front surface. When the display device displays an image, a side or a surface at which the image cannot be observed may be referred to as a rear side or a rear surface. When the display device is viewed from the front side or the front surface, the first long side LS1 may be referred to as an upper side or an upper surface. Likewise, the second long side LS2 may be referred to as a lower side or a lower surface. Likewise, the first short side SS1 may be referred to as a left side or a left surface, and the second short side SS2 may be referred to as a right side or a right surface.

The first long side LS1, the second long side LS2, the first short side SS1, and the second short side SS2 may be referred to as edges of the display device. In addition, points where the first long side LS1, the second long side LS2, the first short side SS1, and the second short side SS2 meet one another may be referred to as corners. For example, a point where the first long side LS1 and the first short side SS1 meet may be referred to as a first corner C1; a point where the first long side LS1 and the second short side SS2 meet may be referred to as a second corner C2; a point where the second short side SS2 and the second long side LS2 meet may be referred to as a third corner C3; and a point where the second long side LS2 and the first short side SS1 meet may be referred to as a fourth corner C4.

Herein, a direction from the first short side SS1 to the second short side SS2 or a direction from the second short side SS2 to the first short side SS1 may be referred to as a left-and-right direction LR. A direction from the first long side LS1 to the second long side LS2 or a direction from the second long side LS2 to the first long side LS1 may be referred to as an up-and-down direction UD.

Referring to FIG. 1, a display panel 110 may be coupled to a plate 120. The plate 120 may be flexible. The plate 120 may be referred to as a flexible plate 120, a frame 120, or a module cover 120. The display panel 110 may be disposed on a front side or front surface of the plate 120. The display panel 110 may be flexible. For example, the display panel 110 may be an OLED panel.

The display panel 110 may be provided on a front surface of a display device 100 and may display an image. The display panel 110 may include a plurality of pixels to output an image in accordance with color, brightness, and chroma of each pixel. The display panel 100 may generate light corresponding to red, green, or blue color in response to a control signal.

The display device 100 may have a variable curvature. The left and right sides of the display device 100 may be configured to move forward. For example, when an image is viewed from the front of the display device 100, the display device 100 may be curved concavely. In this case, the plate 120 may be curved with the same curvature as the display panel 110. Alternatively, the display panel 110 may be curved corresponding to the curvature of the panel 120.

Figure 2:
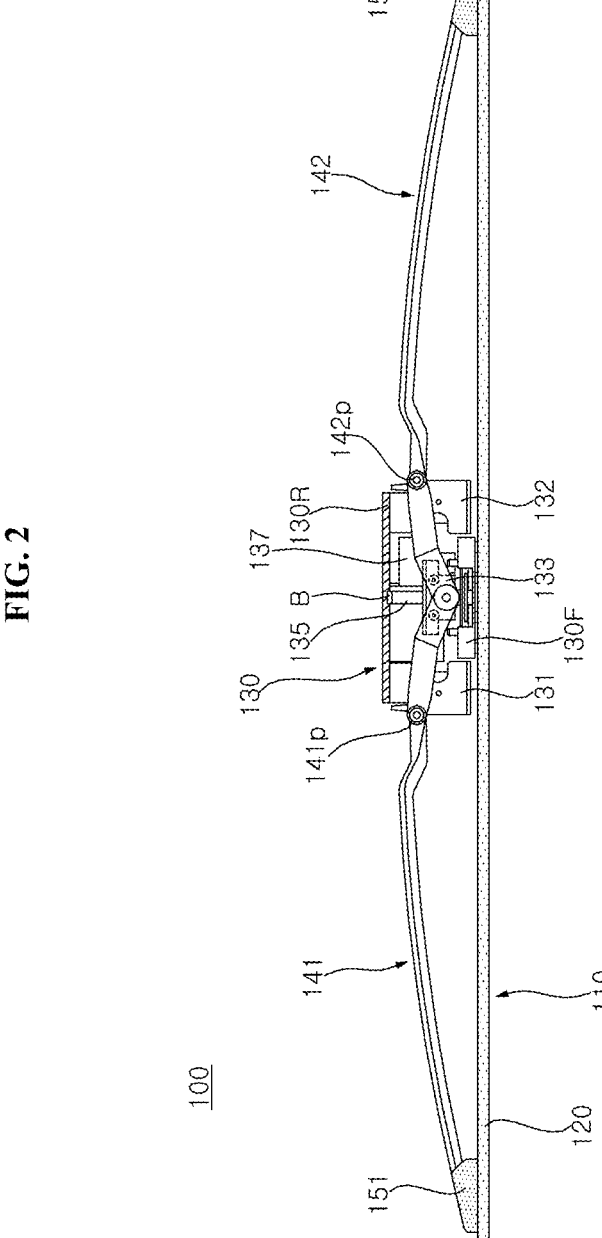
Figure 3:
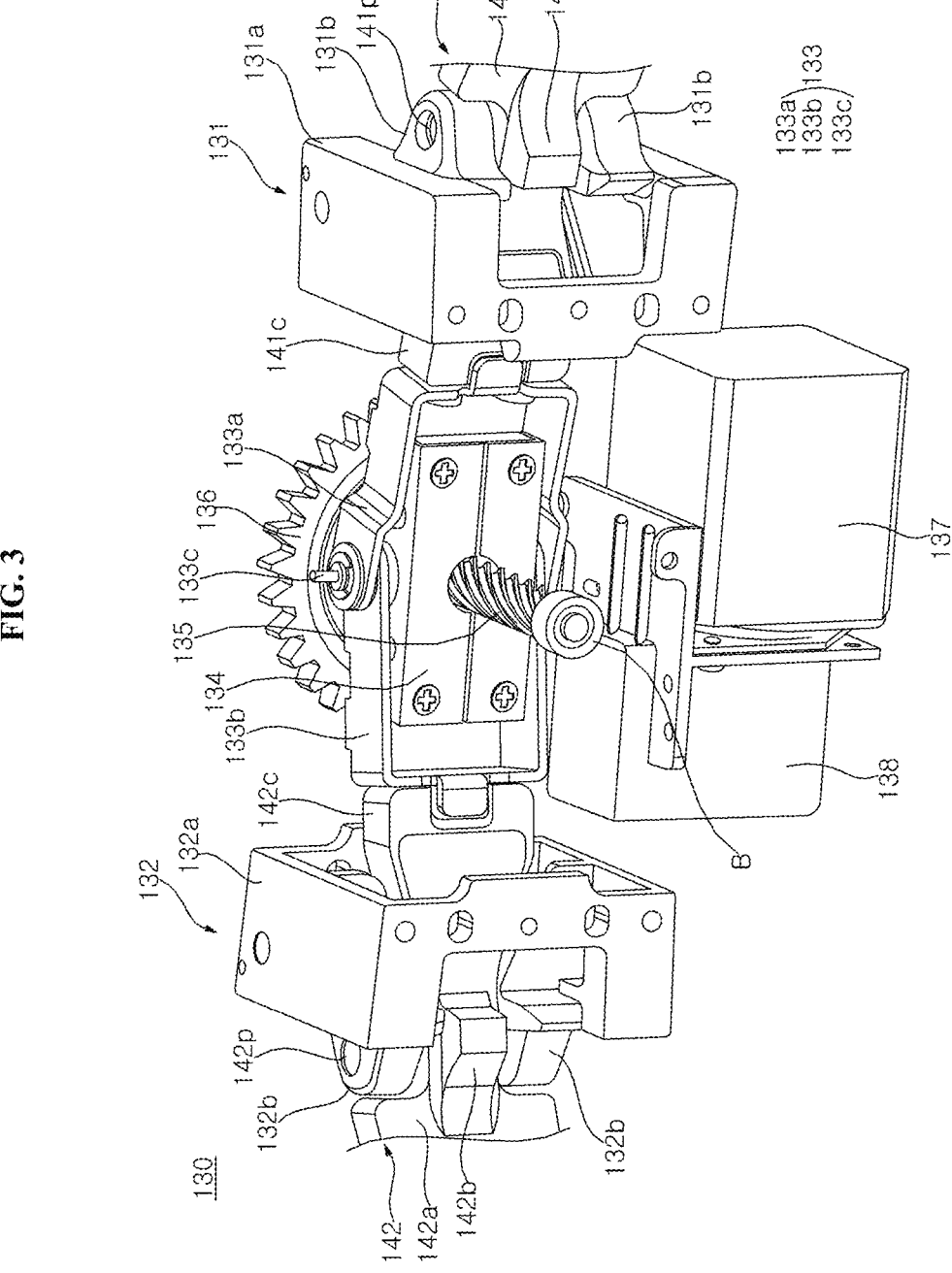

Referring to FIGS. 2 and 3, the plate 120 may be coupled to the rear of the display panel 110. The plate 120 may support the display panel 110 at the rear of the display panel 110. The plate 120 may have a shape corresponding to the display panel 110.

A driving module 130 may be coupled to the rear of the plate 120. A front bracket 130F, a rear bracket 130R, and a wing bracket 131, 132 may be disposed at the rear of the plate 120. The front bracket 130F may be coupled or fixed to a rear surface of the plate 120. The rear bracket 130R may be disposed at the rear of the front bracket 130F, may be spaced apart from the front bracket 130F, and may face the front bracket 130F.

The wing bracket 131, 132 may include a bracket frame 131a, 132a and a wing holder 131b, 132b. The bracket frame 131a, 132a may have a quadrangular box shape. The wing holder 131b, 132b may be formed on one side of the bracket frame 131a, 132a. The wing holder 131b, 132b may protrude from one surface of the bracket frame 131a, 132a. The wing holder 131b, 132b may be configured as a pair. A pair of wing holders 131b, 132b may be disposed opposite each other.

There may be a plurality of wing brackets 131 and 132. The plurality of wing brackets 131 and 132 may include a first wing bracket 131 and a second wing bracket 132. The first wing bracket 131 may be coupled or fixed to the front bracket 130F and/or the rear bracket 130R, and may be disposed opposite the second wing bracket 132 with respect to the front bracket 130F. The second wing bracket 132 may be coupled or fixed to the front bracket 130F and/or the rear bracket 130R.

A wing 141, 142 may include a blade 141a, 142a, a neck 141b, 142b, and a lever 141c, 142c. For example, the wing 141, 142 may be made of metal. As another example, the wing 141, 142 may be made of an aluminum alloy. The blade 141a, 142a may be an elongated plate and may have a rib to ensure rigidity. The lever 141c, 142c and the neck 141b, 142b may be formed at one end of the blade 141a, 142a. The neck 141b, 142b may be disposed between the lever 141c, 142c and the blade 141a, 142a to connect the lever 141c, 142c and the blade 141a, 142a. A width of the neck 141b, 142b may be less than a width of the lever 141c, 142c, and the width of the lever 141c, 142c may be less than a width of the blade 141a, 142a. A pivot shaft 141p, 142p may be formed at the neck 141b, 142b. The pivot shaft 141p, 142p may be inserted into the wing holder 131b, 132b. The wing 141, 142 may pivot about the pivot shaft 141p, 142p and the wing holder 131b, 132b.

A first wing 141 may be rotatably or pivotably coupled to the first wing bracket 131, and a second wing 142 may be rotatably or pivotably coupled to the second wing bracket 132. The first wing 141 and the second wing 142 may be symmetric with respect to the driving module 130.

A sliding mount 151, 152 may be coupled or fixed to the rear or rear surface of the plate 120. A first sliding mount 151 may be positioned adjacent to a left side of the plate 120, and a second sliding mount 152 may be positioned adjacent to a right side of the plate 120. An end of the first wing 141 may be movably coupled to the first sliding mount 151. An end of the second wing 142 may be movably coupled to the second sliding mount 152.

A flip frame 133 may be disposed between the lever 141c of the first wing 141 and the lever 142c of the second wing 142, and may be coupled to the levers 141c and 142c. For example, the flip frame 133 may be made of metal. The flip frame 133 may include a first frame 133a and a second frame 133b. For example, the first frame 133a may have a U-shape, and the second frame 133b may have a U-shape. The first frame 133a and the second frame 133b may be pivotably connected to each other. A pivot pin 133c may pass through the first frame 133a and the second frame 133b to connect the first frame 133a and the second frame 133b. The first frame 133a may pivot in relation to the second frame 133b, and the second frame 133b may pivot in relation to the first frame 133a. The first frame 133a may be fixed or coupled to the lever 141c of the first wing 141, and the second frame 133b may be fixed or coupled to the lever 142c of the second wing 142.

A moving block 134 may be disposed inside the flip frame 133. The moving block 134 may be disposed between the first frame 133a and the second frame 133b of the flip frame 133.

A lead screw 135 may be inserted into the moving block 134. As the lead screw 135 is rotated, the moving block 134 may move on the lead screw 135. Rotation and reverse rotation of the lead screw 135 may cause the moving block 134 to perform a reciprocating motion on the lead screw 135.

The lead screw 135 may be coupled to a driving gear 136 and may rotate together with the driving gear 136. The driving gear 136 may rotate while facing the rear surface of the plate 120 (see FIG. 2). The lead screw 135 may be a rotating shaft of the driving gear 136. A bearing B may be coupled to one end and/or both ends of the lead screw 135. The lead screw 135 may rotate with its one end being inserted into a front bearing B and its other end being inserted into a rear bearing B. For example, the lead screw 135 may be press-fitted into the front bearing B and the rear bearing B.

A motor 137 may be disposed under the moving block 134. The motor 137 may provide torque. A gear box 138 may transmit the torque of the motor 137 to the driving gear 136.

Figure 4:
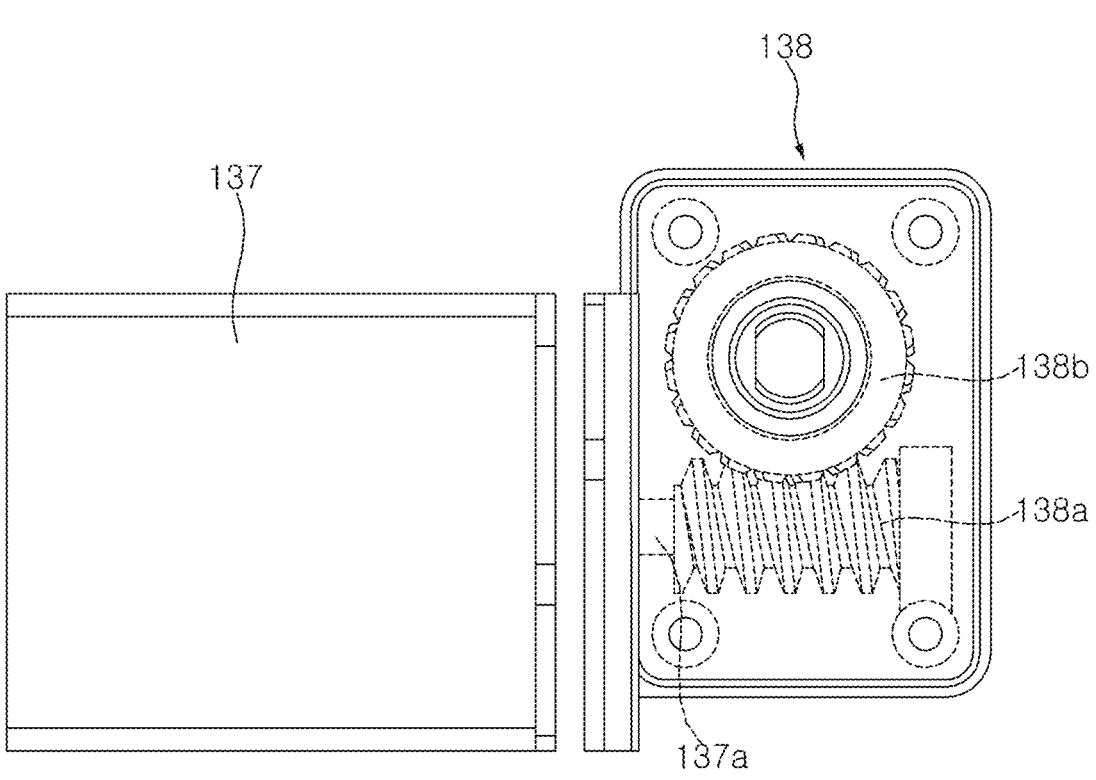
Figure 5:
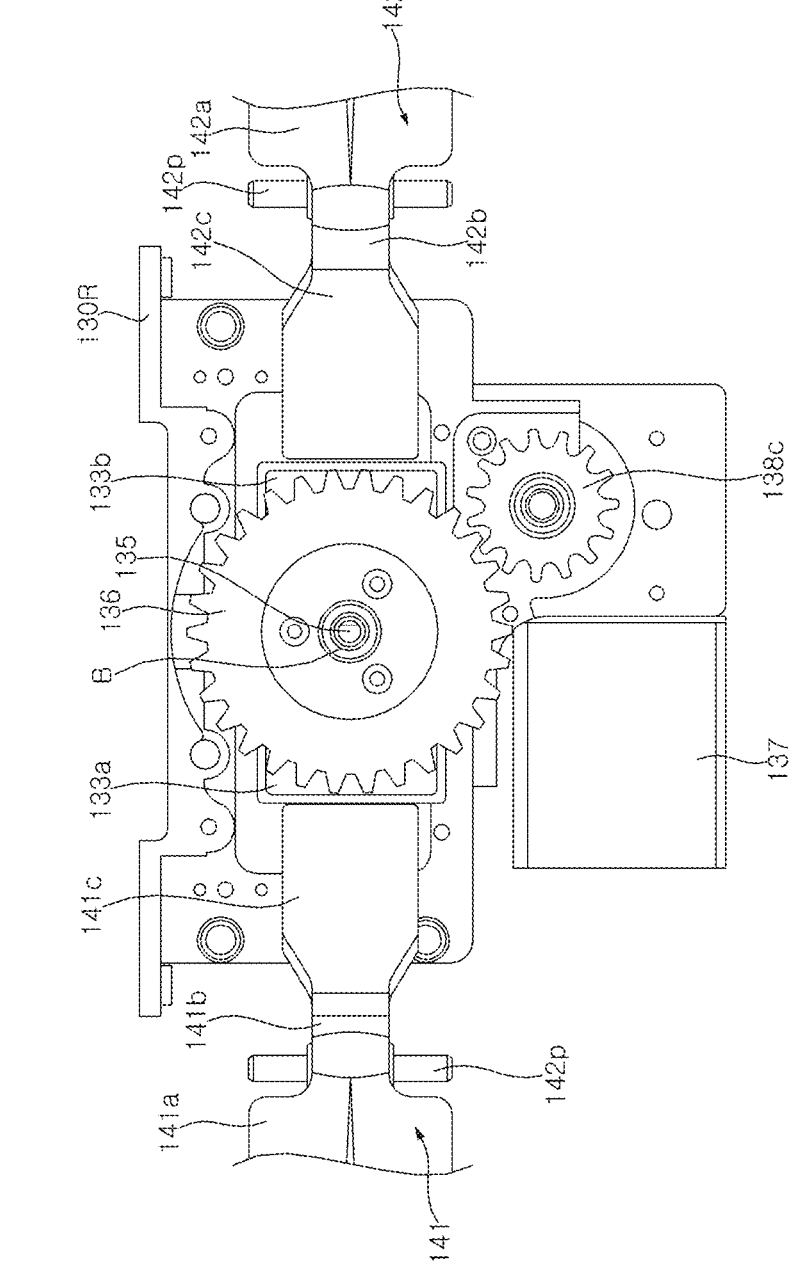

Referring to FIGS. 4 and 5, a first gear 138a may be fixed to a rotating shaft 137a of the motor 137 so as to rotate together with the rotating shaft 137a of the motor 137. For example, the first gear 138a may be a worm. A second gear 138b may mesh with the first gear 138a. For example, the second gear 138b may be a worm gear.

The first gear 138a and the second gear 138b may be disposed inside the gear box 138. A transmission gear 138c may be disposed outside the gear box 138. The transmission gear 138c may be fixed to the rotating shaft 137a of the second gear 138b and may rotate together with the second gear 138b. The transmission gear 138c may mesh with the driving gear 136.

The lead screw 135 may be a rotating shaft of the driving gear 136. The driving gear 136 may be fixed to the lead screw 135. The driving gear 136 may be coupled to the lead screw 135 by a pin.

Figure 6:
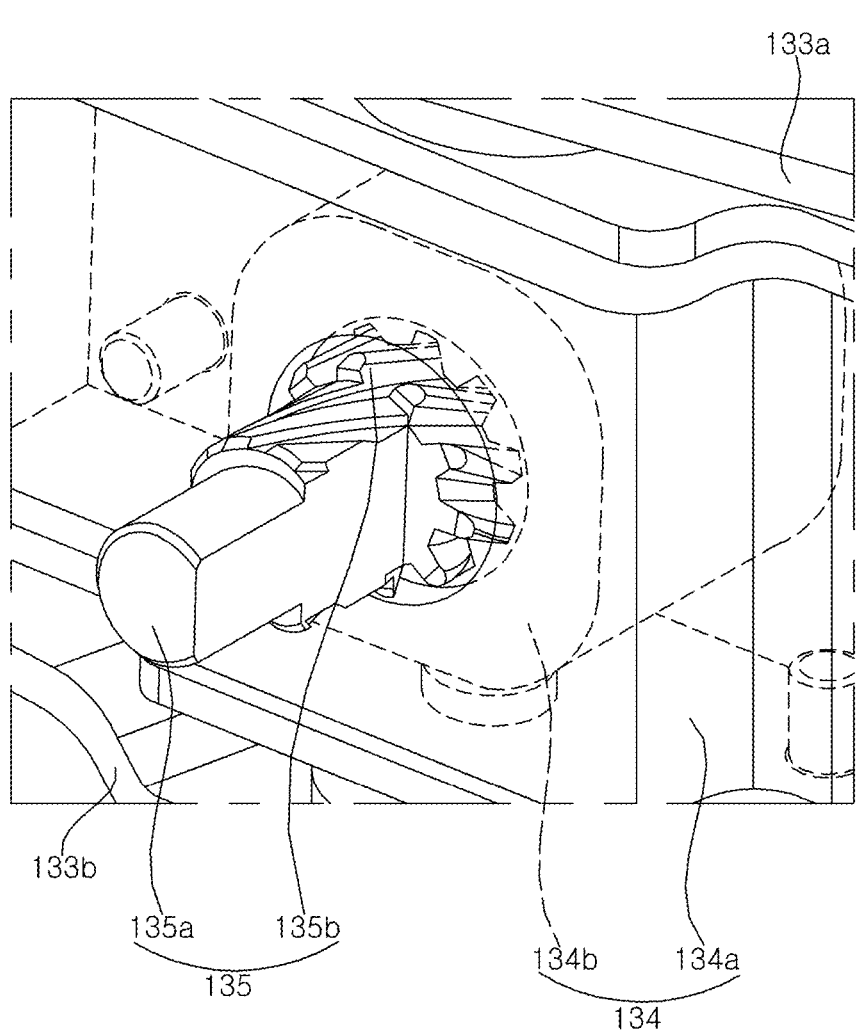

Referring to FIG. 6, the lead screw 135 may include a shaft body 135a and a screw 135b. The shaft body 135a may be in the shape of an elongated cylinder, and the screw 135b may be formed on an outer circumferential surface of the shaft body 135a. The moving block 134 may include a moving body 134a and a sliding block 134b. For example, the moving body 134a may be made of metal, and the sliding block 134b may be made of a synthetic resin. The sliding block 134b may be disposed inside the moving body 134a. The sliding block 134b may be screw-coupled to the lead screw 135.

The lead screw 135 may be inserted into the sliding block 134b. As the lead screw 135 is rotated, the sliding block 134b may move on the lead screw 135. A clearance may be formed between an inner circumferential surface of the sliding block 134b and the screw 135b of the lead screw 135. Accordingly, the moving block 134 may be prevented from being caught or locked while moving on the lead screw 135.

Figure 7:
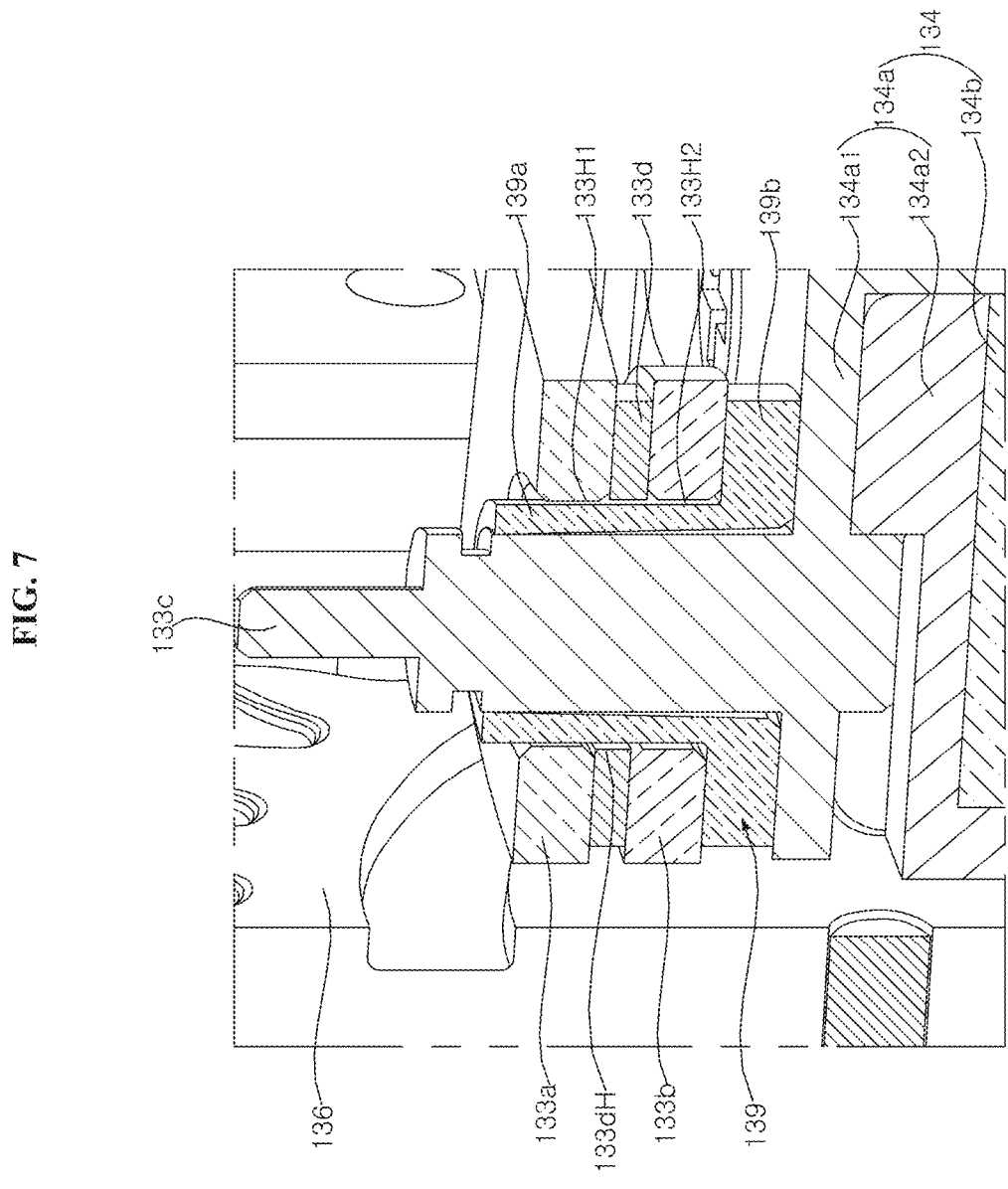

Referring to FIG. 7, the moving body 134a may include an outer part 134a1 and an inner part 134a2. The outer part 134a1 may define an outer surface of the moving body 134a. The inner part 134a2 may be coupled to the inside of the outer part 134a1. For example, the outer part 134a1 may be a U-shaped metal plate, and the inner part 134a2 may be a metal shell having an accommodation space therein. The sliding block 134b may be coupled to the inside of the inner part 134a2.

The pivot pin 133c may protrude and extend from the outer part 134a1 of the moving body 134a. The first frame 133a and the second frame 133b of the flip frame 133 may include holes 133H1 and 133H2. The pivot pin 133c may be inserted into the hole 133H2 of the second frame 133b and the hole 133H1 of the first frame 133a. A disk 133d may be disposed between the first frame 133a and the second frame 133b, and the pivot pin 133c may be inserted into a hole 133dH of the disk 133d. For example, the disk 133d may be made of a material with high durability and low friction.

An intermediate member 139 may be disposed between the moving body 134a, the pivot pin 133c, and the flip frame 133. The intermediate member 139 may cover an upper surface of the moving body 134a and an outer surface of the pivot pin 133c. The intermediate member 139 may be referred to as a low friction member 139 or a lubricating member 139. The intermediate member 139 may also be referred to as a skin member 139.

The intermediate member 139 may include a body portion 139a and a flange portion 139b. The body portion 139a may have a cylindrical shape. The pivot pin 133c may be inserted into the body portion 139a. The body portion 139a may be in contact with the outer surface of the pivot pin 133c, and the flange portion 139b may be in contact with the upper surface of the moving body 134a. The intermediate member 139 may be made of a synthetic resin with low friction. The intermediate member 139 may be made of a low-friction material. For example, the intermediate member 139 may be made of POM acetal homopolymer. The first frame 133a and the second frame 133*b* of the flip frame 133 may move about the pivot pin 133*c* while making contact with or rubbing against the intermediate member 139.

The intermediate member 139 may fill a gap between the pivot pin 133*c* and the hole 133H1 of the first frame 133*a* of the flip frame 133. The intermediate member 139 may fill a gap between the pivot pin 133*c* and the hole 133H2 of the second frame 133*b* of the flip frame 133. The second frame 133*b* of the flip frame 133 may be placed on the intermediate member 139. Accordingly, the pivot pin 133*c* may transmit force to the flip frame 133 without causing noise or vibration.

Figure 8:
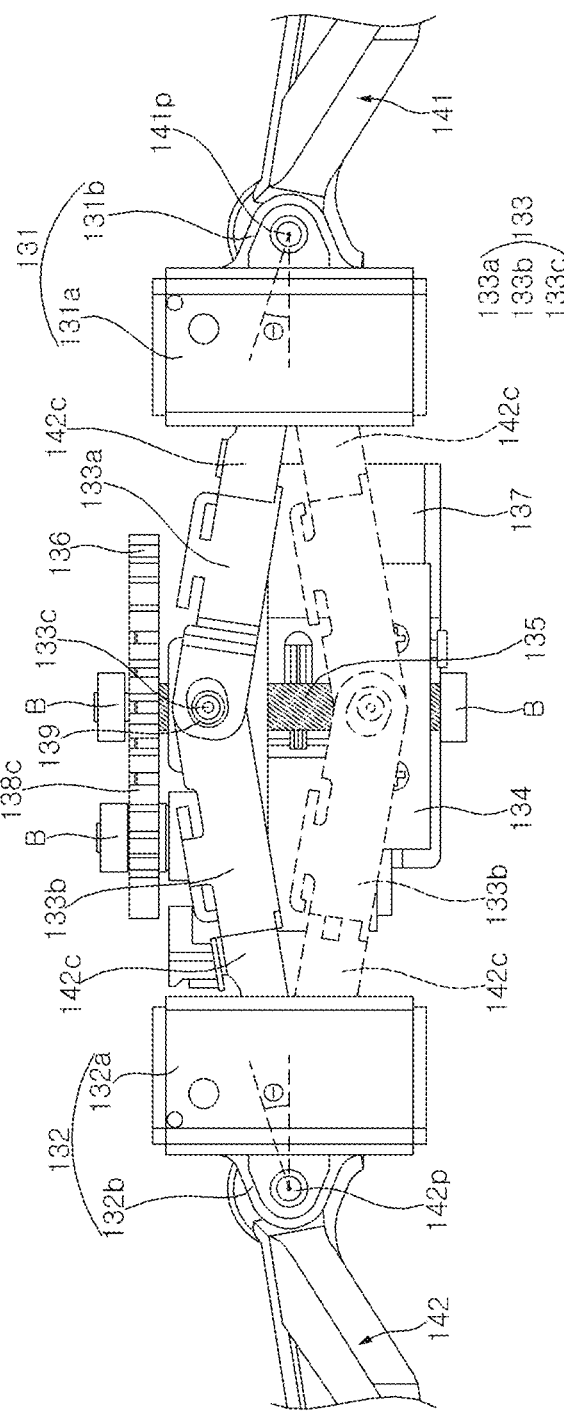
Figure 9:
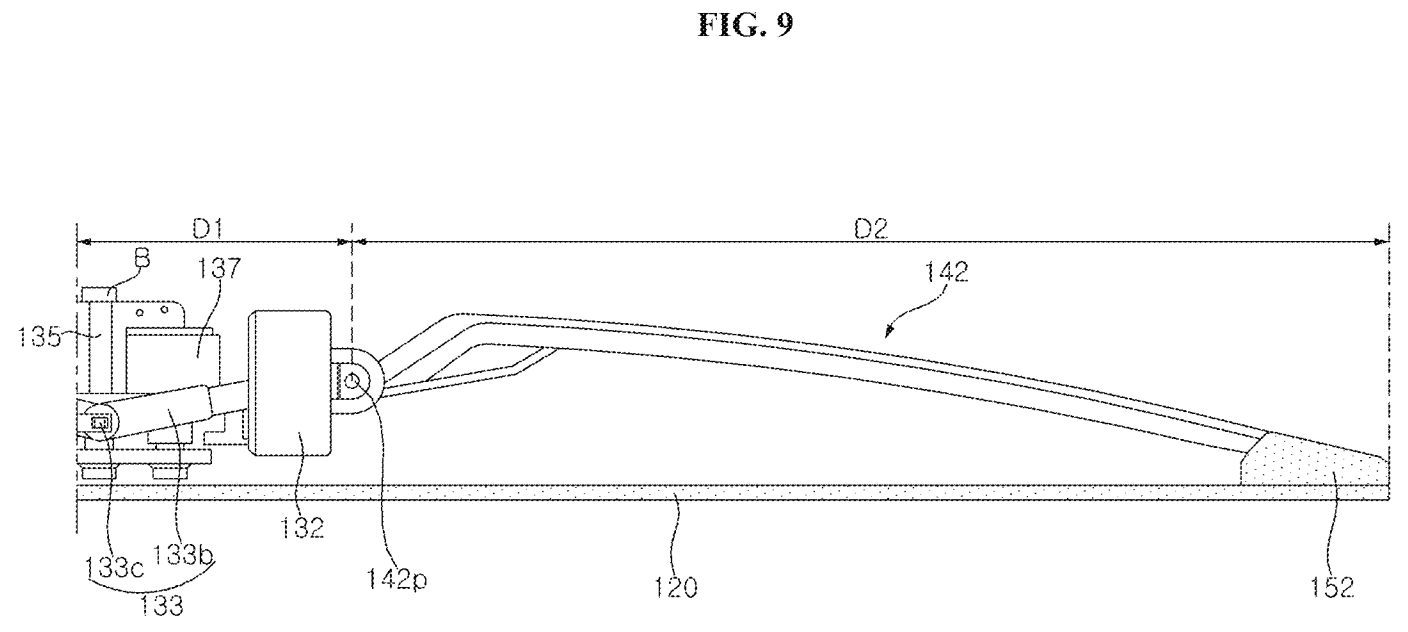

Referring to FIGS. 8 and 9, when the lead screw 135 is rotated, the moving block 134 and the flip frame 133 may move on the lead screw 135. The flip frame 133 may reciprocate in a longitudinal direction of the lead screw 135. The movement of the flip frame 133 may cause the first wing 141 and/or the second wing 142 to pivot about the pivot shaft 141P, 142P.

A first distance D1 from the pivot pin 133*c* to the pivot shaft 141P, 142P may be less than a second distance D2 from the pivot shaft 141P, 142P to the sliding mount 151, 152. For example, the first distance D1 may be ¼ of the second distance D1. As the lever 141*c*, 142*c* of the wing 141, 142 are fixed to the flip frame 133, and the flip frame 133 moves together with the pivot pin 133*c*, a driving force of the moving block 134 moving on the lead screw 135 may be efficiently transmitted to the lever 141*c*, 142*c* of the wing 141, 142 through the flip frame 133.

In addition, as the lever 141*c*, 142*c* of the wing 141, 142 are fixed to the flip frame 133 and move together with the flip frame 133, the first distance D1 increases, such that less force is required to drive the wings 141 and 142. Thus, it is possible to increase power transmission efficiency of the driving unit 130 and to reduce power consumption of the motor 137.

Figure 10:
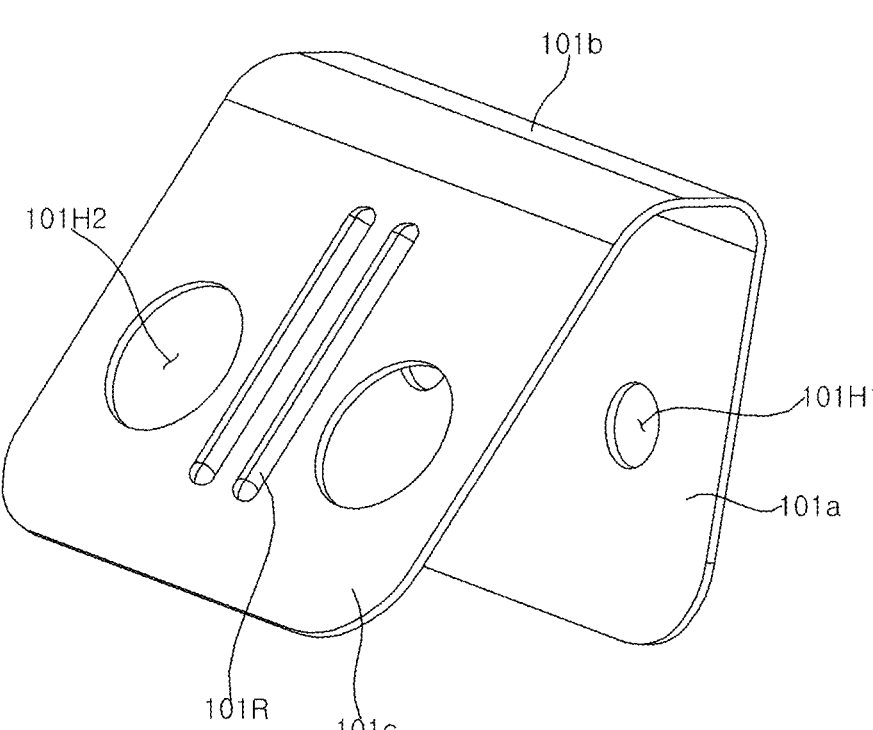
Figure 11:
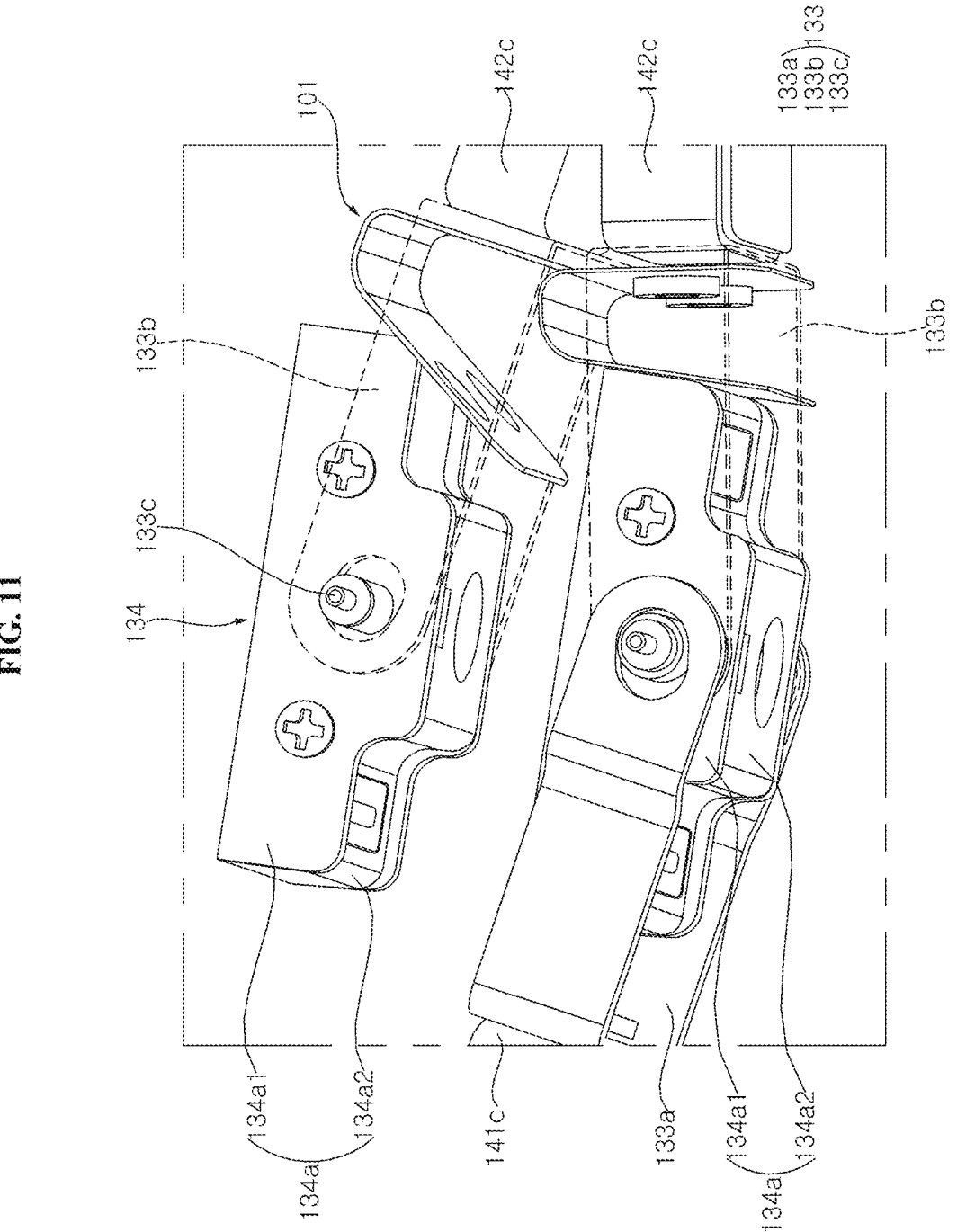

Referring to FIGS. 10 and 11, an elastic member 101 may include a first part 101*a*, a second part 101*b*, and a third part 101*c*. The elastic member 101 may be referred to as a first elastic member 101 or a clip 101. The first part 101*a* may be a plate. The second part 101*b* may be bent and extend from the first part 101*a*. The third part 101*c* may be bent and extend from the second part 101*b*. The third part 101*c* may face the first part 101*a*. A second angle formed by the second part 101*b* and the third part 101*c* may be greater than a first angle formed by the first part 101*a* and the second part 101*b*. In the extending direction, the third part 101*c* may be greater in length than the first part 101*a*. The elastic member 101 may be a metal plate and may have elasticity. For example, the elastic member 101 may be a leaf spring.

A coupling hole 101H1 may be formed in the first part 101*a*. The coupling hole 101H1 may be provided in plurality. A support rib 101R may be formed on the third part 101*c*. The support rib 101R may be elongated in the direction in which the third part 101*c* extends. The support rib 101R may be provided in plurality. The support rib 101R may protrude from an outer surface of the third part 101*c*. The plurality of support ribs 101R may be parallel to each other.

The elastic member 101 may be inserted between the moving block 134 and the lever 141*c*, 142*c* of the wing 141, 142. The first part 101*a* of the elastic member 101 may be fixed to the lever 141*c*, 142*c* of the wing 141, 142. For example, the first part 101*a* of the elastic member 101 may be screw-coupled to the lever 141*c*, 142*c* of the wing 141, 142. The third part 101*c* of the elastic member 101 may support the moving block 134. The third part 101*c* of the elastic member 101 may be in contact with a side surface of the moving block 134. The third part 101*c* of the elastic member 101 may be in contact with the outer part 134*a*1 and/or the inner part 134*a*2 of the moving body 134*a*. The outer part 134*a*1 and/or the inner part 134*a*2 of the moving body 134*a* in contact with the third part 101*c* of the elastic member 101 may be rounded. The support rib 101R formed on the third part 101*c* of the elastic member 101 may be in contact with the inner part 134*a*2 of the moving block 134.

There may be a plurality of elastic members 101. The plurality of elastic members 101 may be inserted between the moving block 134 and the lever 141*c* of the first wing 141 and between the moving block 134 and the lever 142*c* of the second wing 142, respectively.

In a mechanism in which the flip frame 133 flips or pivots about the pivot pin 133*c*, a clearance may be formed between the pivot pin 133*c* of the moving block 134 and the hole 133H1, 133H2 (see FIG. 7) of the flip frame 133. The elastic member 101 may push the moving block 134 in one direction. As the elastic member 101 pushes the moving block 134 in one direction, the pivot pin 133*c* of the moving block 134 may be in close contact with one side of the hole 133H1, 133H2 of the flip frame 133.

Accordingly, force may be transmitted to the flip frame 133 in the entire region where the moving block 134 moves on the lead screw 135. In a mechanism in which the moving block 134 transmits force to the flip frame 133, bending of the display panel 110 may be temporarily interrupted by a clearance between the components. In this embodiment, continuous bending of the display panel 110 may be achieved.

Figure 12:
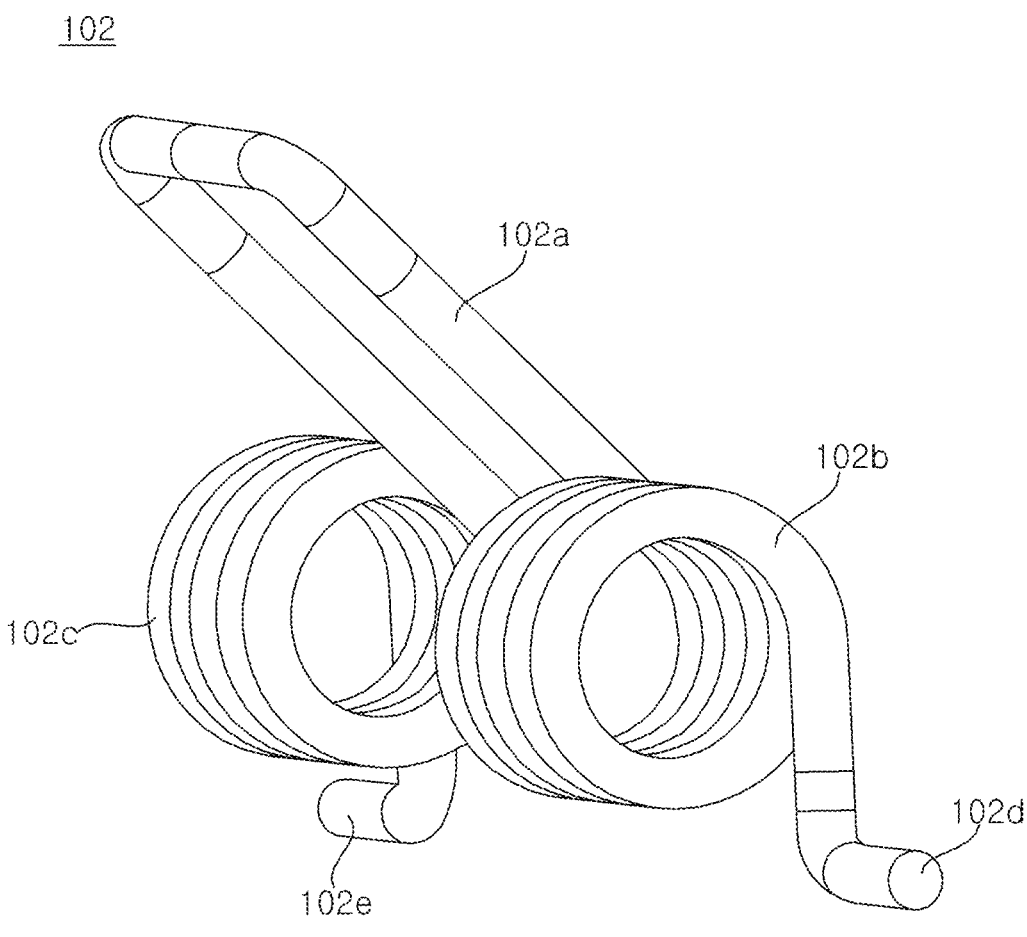
Figure 13:
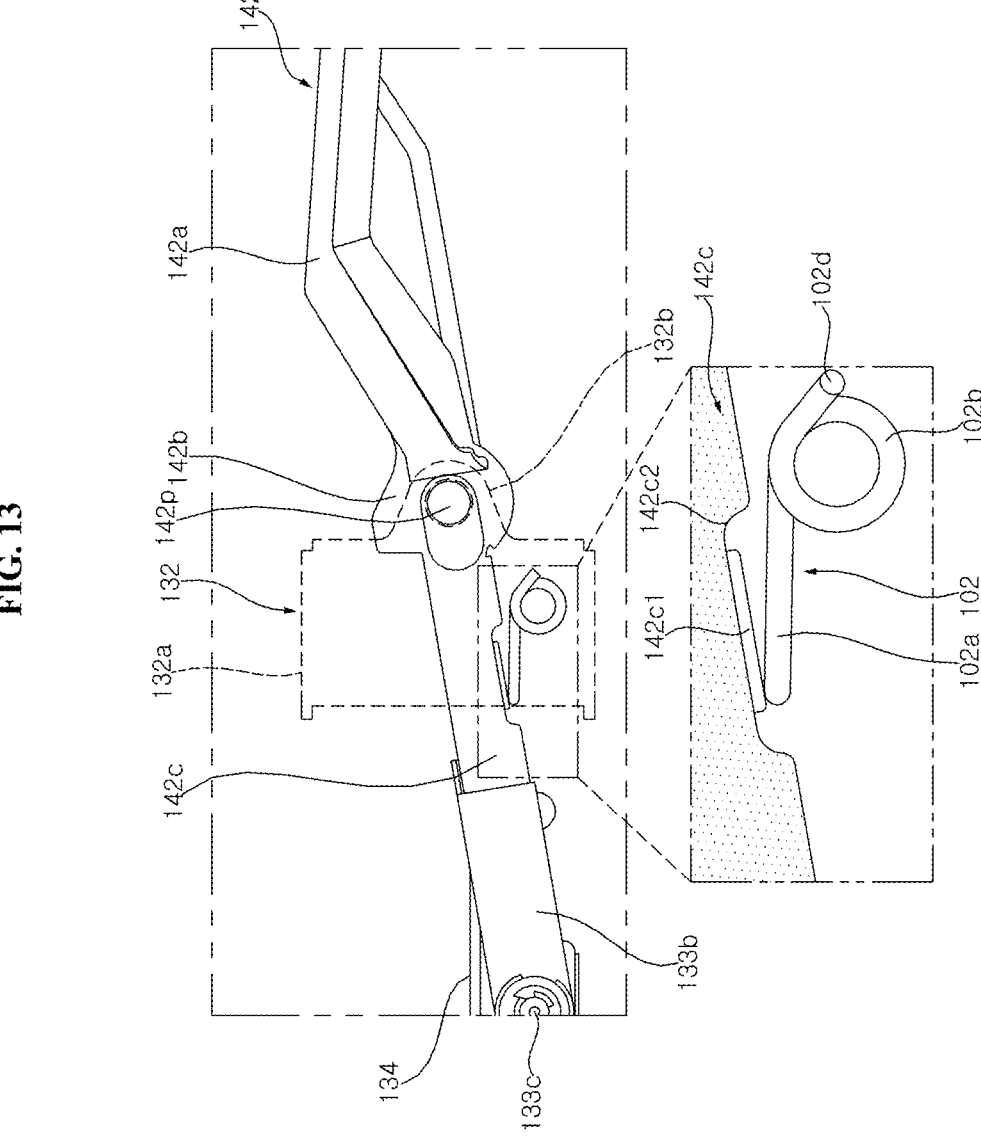

Referring to FIGS. 12 and 13, an elastic member 102 may include a lever portion 102*a*, a support portion 102*d*, 102*e*, and a coil portion 102*b*, 102*c*. The elastic member 102 may be configured as a wire. The elastic member 102 may be referred to as a second elastic member 102.

The lever portion 102*a* may be a wire bent in a U-shape. The coil portion 102*b*, 102*c* may be connected to the lever portion 102*a*. There may be a plurality of coil portions 102*b* and 102*c*. A first coil portion 102*b* may be connected to one end (or a first end) of the lever portion 102*a*, and a second coil portion 102*c* may be connected to the other end (or a second end) of the lever portion 102*a*. There may be a plurality of support portions 102*d* and 102*e*. A first support portion 102*d* may form an end of the first coil portion 102*b*, and a second support portion 102*e* may form an end of the second coil portion 102*c*.

When the support portions 102*d* and 102*e* are fixed, the lever portion 102*a* may rotate or pivot about the coil portions 102*b* and 102*c*. The coil portions 102*b* and 102*c* may provide elasticity to the lever portion 102*a*.

The elastic member 102 may be installed on the wing bracket 132. The support portions 102*d* and 102*e* of the elastic member 102 may be fixed to the bracket frame 132*a* of the wing bracket 132. The lever portion 102*a* of the elastic member 102 may be supported by the lever 142*c* of the wing 142.

The wing 142 may include a support groove 142*c*2 and a friction pad 142*c*1. The support groove 142*c*2 may be formed at a position corresponding to a portion of a length of the lever portion 102*a* of the elastic member 102. The friction pad 142*c*1 may be formed on the support groove 142*c*2. The friction pad 142*c*1 may protrude from the support groove 142*c*2 and its surface may be smoothly polished.

When the wing 141, 142 is pivotably coupled to the wing bracket 131, 132, a clearance may be formed between the pivot shaft 141*p*, 142*p* of the wing 141, 142 and the wing holder 131*b*, 132*b* of the wing bracket 131, 132. In a mechanism in which the moving block 134 transmits force to the flip frame 133 to allow the wings 141 and 142 to bend the display panel 110, bending of the display panel 110 may be temporarily interrupted by the clearance between the components. The wing 141, 142 may receive force from the elastic member 102 in a forward direction of the display device 100, thereby allowing for continuous bending of the display panel 110. Also, it is possible to reduce power consumption of the motor 137 required to bend the display panel 110.

In addition, as the sliding block 134*b* (see FIG. 6) is screw-coupled to the lead screw 135, a clearance for the sliding block 134*b* to move on the lead screw 135 may be formed. As the elastic member 102 pushes the wing 141, 142 to press the sliding block 134*b* in one direction of the lead screw 135, continuous bending of the display panel 110 may be achieved. Further, when the torque of the motor 137 and the lead screw 135 is released while the display panel 100 is in a flat state, flatness of the display panel 110 may be changed. In this embodiment, the display panel 110 may remain flat and/or curved with a predetermined curvature.

Figure 14:
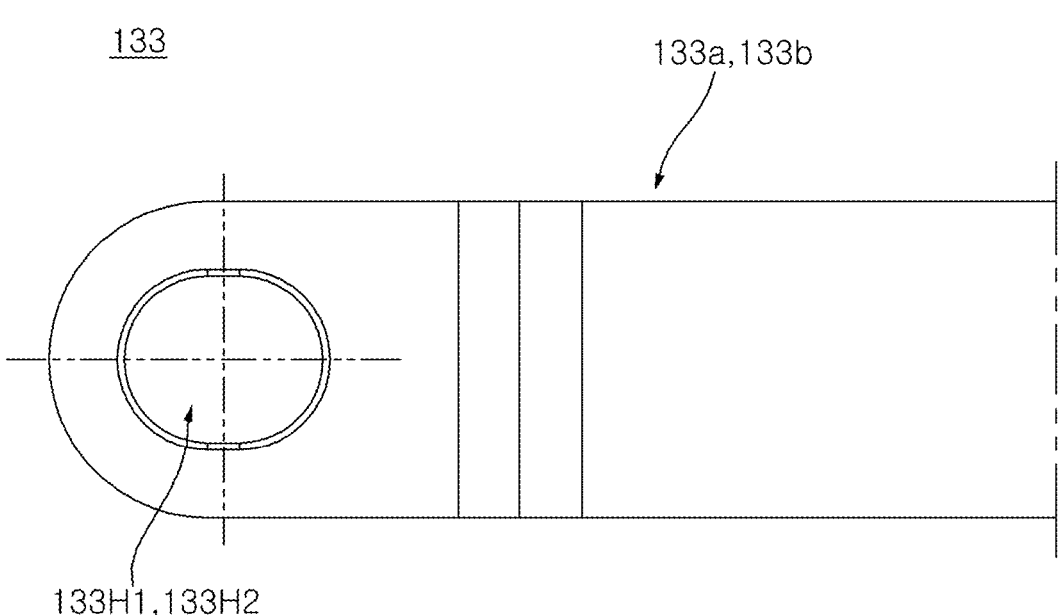

Referring to FIG. 14, the flip frame 133 may have the holes 133H1 and 133H2. The hole 133H1, 133H2 may be positioned adjacent to an end of the first frame 133*a* and/or the second frame 133*b* of the flip frame 133. The hole 133H1, 133H2 may be a long hole 133H1, 133H2 having a major axis and a minor axis. The major axis of the hole 133H1, 133H2 may be parallel to a longitudinal direction of the frame 133. The minor axis of the hole 133H1, 133H2 may intersect the longitudinal direction of the frame 133.

Figure 15:
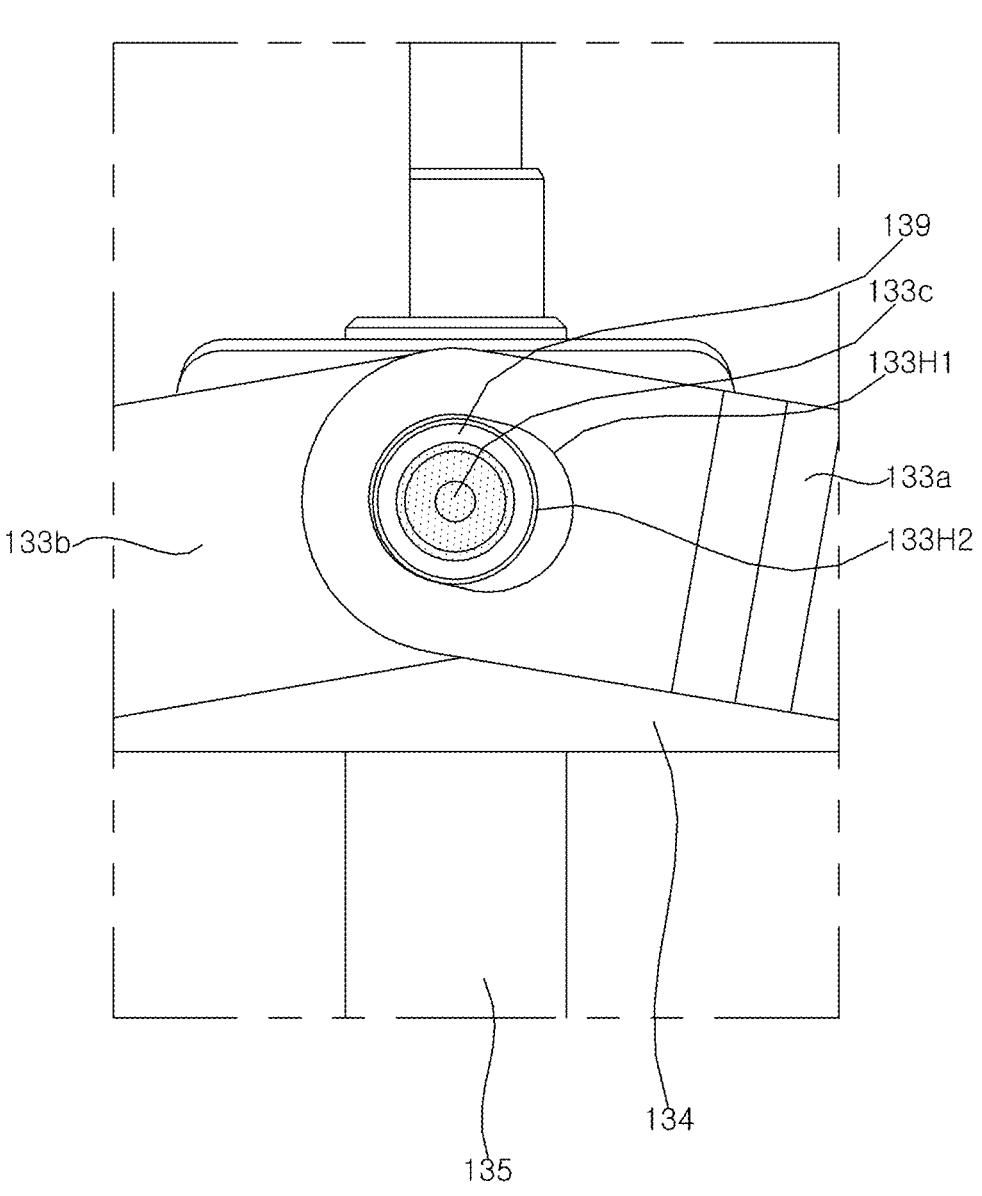
Figure 16:
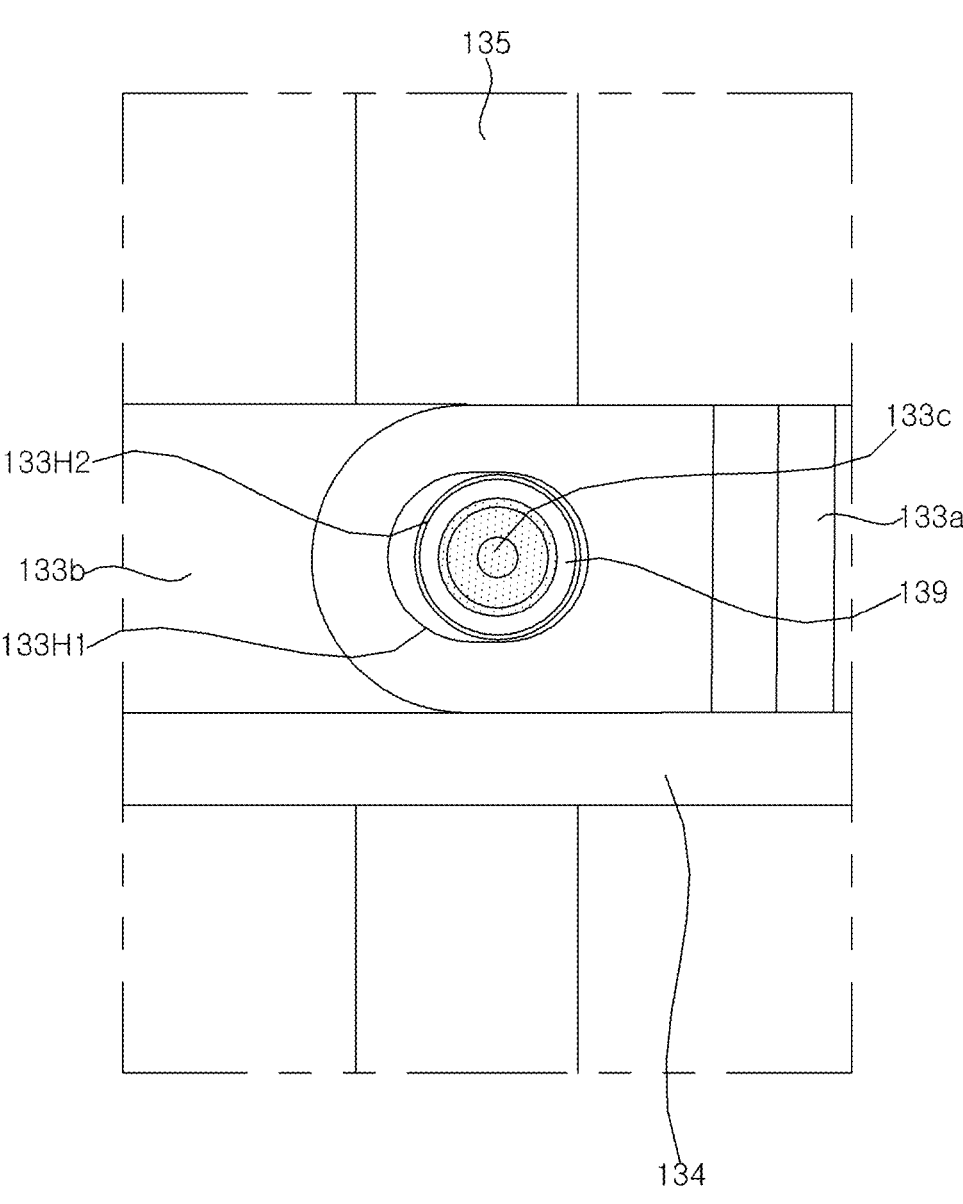
Figure 17:
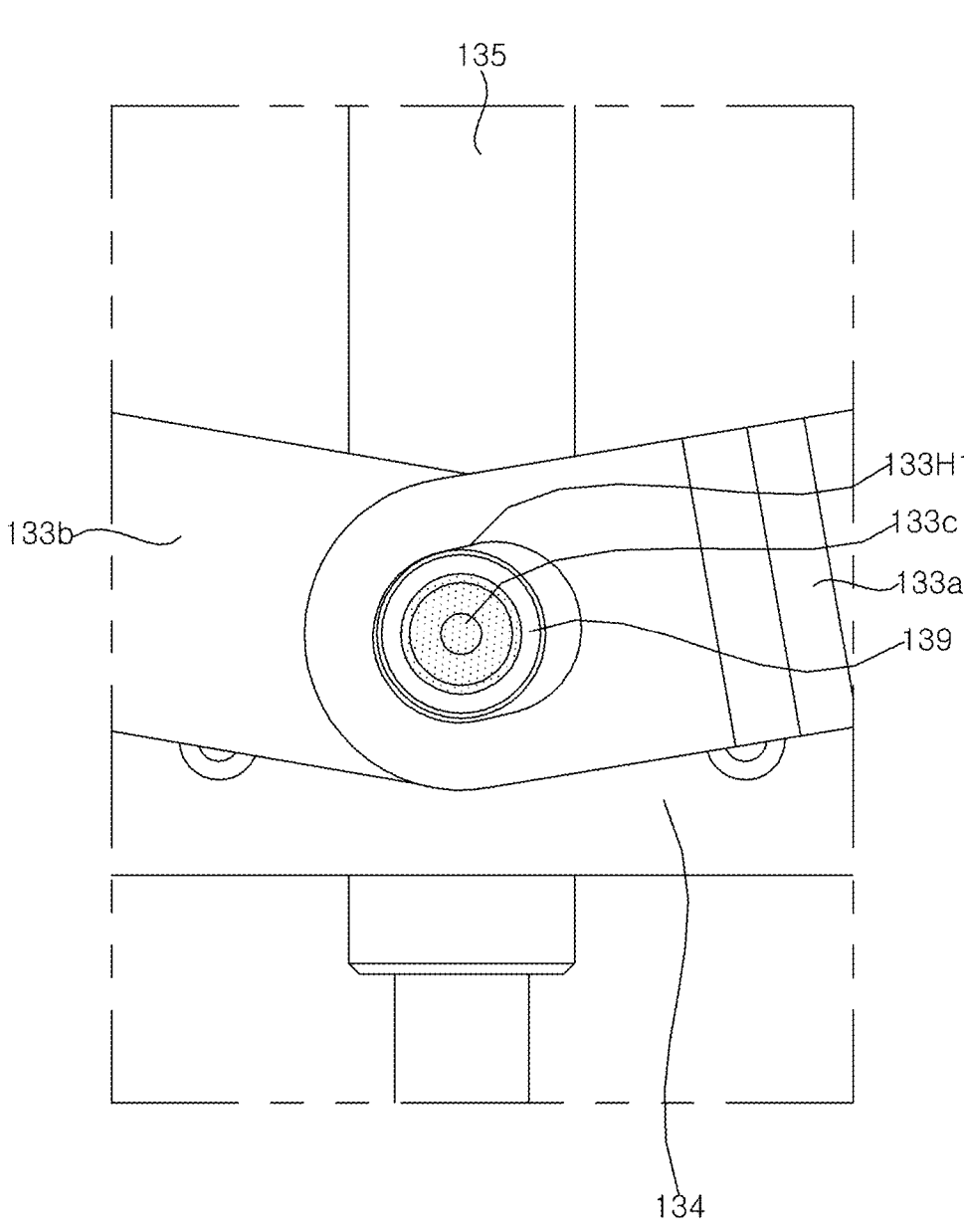

Referring to FIGS. 15 to 17, the pivot pin 133*c* may be inserted into the holes 133H1 and 133H2 of the flip frame 133, and the moving block 134 may be movable on the lead screw 135. As the moving block 134 moves on the lead screw 135, the display panel 110 in a flat state (see FIG. 15) may be curved (see FIG. 16) to be in a curved state in which the display panel 110 is curved with a constant curvature (see FIG. 17).

When the display panel 110 starts to switch from the flat state to the curved state or when the display panel 110 curved with a predetermined curvature changes to the flat state as a radius of curvature becomes greater than a predetermined radius of curvature, a moving direction of the moving block 134 may be changed. That is, at a start point and an end point of the moving block 134, the display panel 110 may be flat or curved with a predetermined curvature.

When the moving direction of the moving block is changed at the start point and/or the end point, a direction in which the pivot pin 133*c* applies force to the holes 133H1 and 133H2 of the flip frame 133 may be changed. As the direction in which the pivot pin 133*c* applies force to the holes 133H1 and 133H2 of the flip frame 133 is changed, the continuity of change in curvature of the display panel 110 may be broken by the clearance between the pivot pin 133*c* and the hole 133H1, 133H2 of the flip frame 133.

Figure 18:
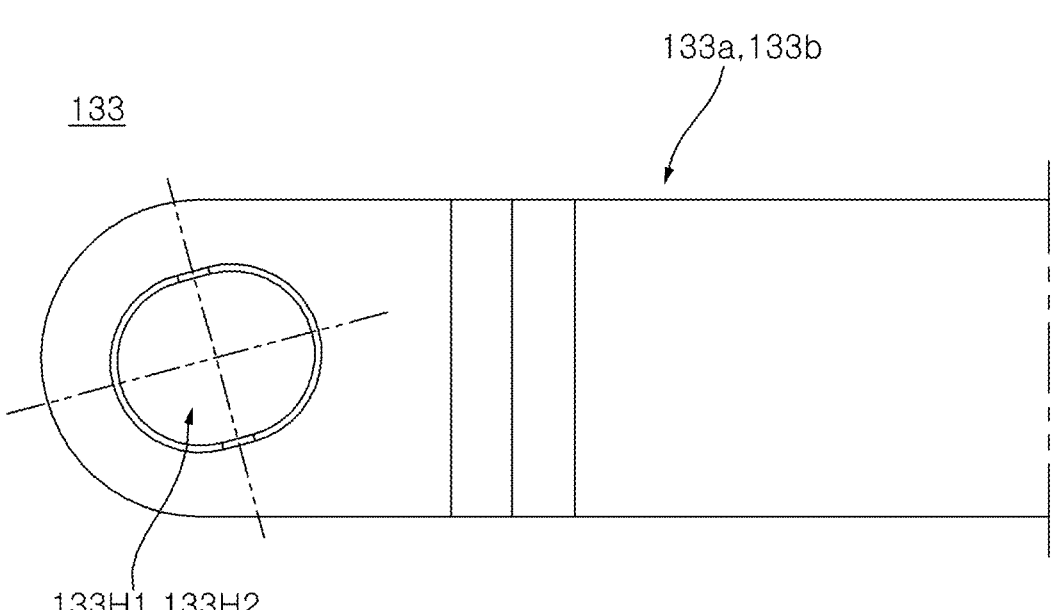
Figure 19:
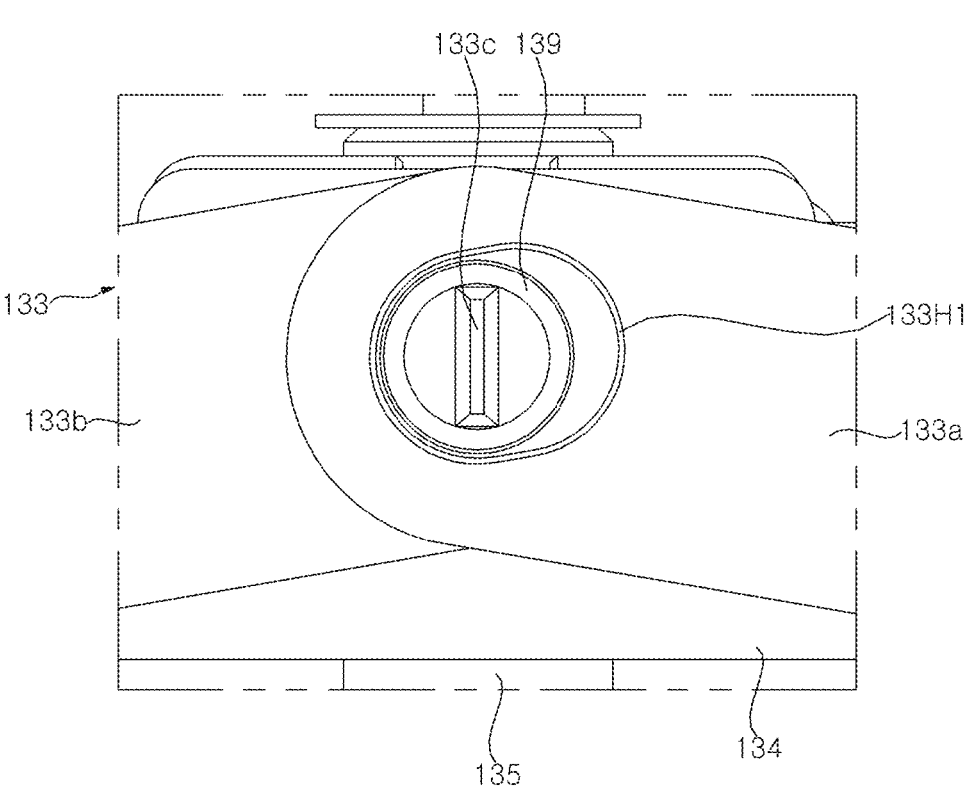

Referring to FIGS. 18 and 19, the major axis of the hole 133H1, 133H2 of the flip frame 133 may form an angle θ with respect to a longitudinal direction of the flip frame 133. For example, the angle θ may correspond to an angle θ formed by the start point or the end point of the moving block 134 and the pivot shaft 141*p*, 142*p* of the wing 141, 142 (see FIG. 8) with respect to a line connecting the pivot shafts 141*p* and 142*p* of the wings 141 and 142.

As the holes 133H1 and 133H2 of the flip frame 133 approach the start point or the end point of the moving block 134, the major axis of the hole 133H1, 133H2 may become parallel to a baseline connecting the pivot shafts 141*p* and 142*p* of the wings 141 and 142 of the moving block 134. When a moving direction of the pivot pin 133*c* is changed, the moving direction of the pivot pin 133*c* may be aligned with a direction of the minor axis of the hole 133H1, 133H2 of the flip frame 133.

When the moving direction of the pivot pin 133*c* is aligned with the minor axis of the hole 133H1, 133H2 of the flip frame 133 as the moving direction of the pivot pin 133*c* is changed, the clearance formed between the pivot pin 133*c* and the hole 133H1, 133H2 may be minimized. Accordingly, by the movement and/or direction change of the moving block 134, the pivot pin 133*c* may continuously transmit power or force to the flip frame 133.

Figure 20:
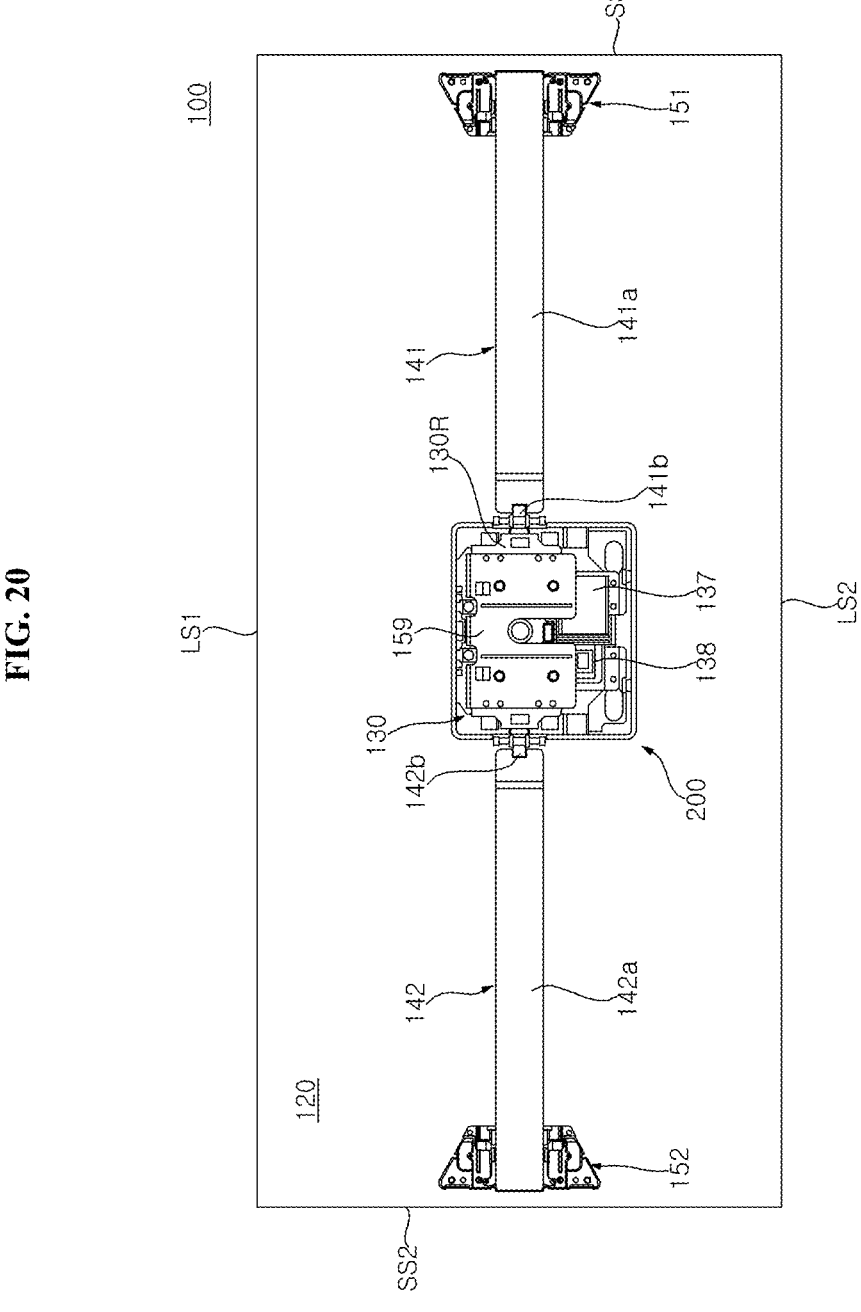
Figure 21:
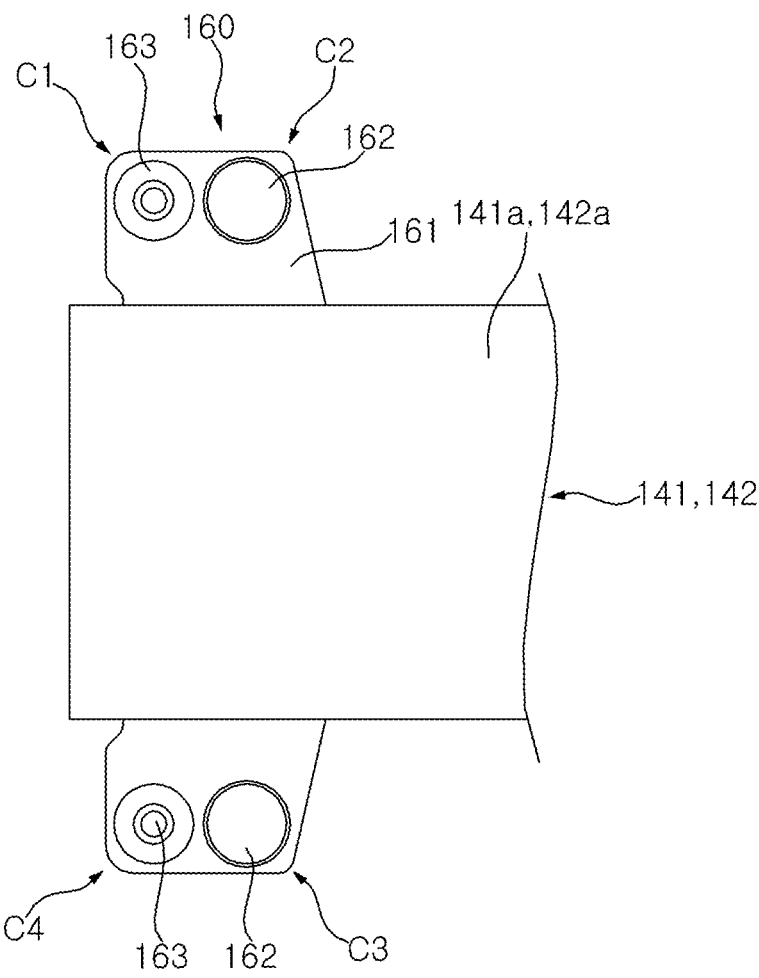

Referring to FIGS. 20 and 21, a first sliding mount 151 may be fixed to the rear surface of the plate 120 while being adjacent to the first short side SS1 of the plate 120. A second sliding mount 152 may be fixed to the rear surface of the plate 120 while being adjacent to the second short side SS2 of the plate 120.

The driving module 130 may be disposed between the first sliding mount 151 and the second sliding mount 152, and may be coupled to the rear surface of the plate 120. The first wing 141 may have a first end pivotably connected to the driving module 130 and a second end coupled to the first sliding mount 151. The second end of the first wing 141 may be movable on the first sliding mount 151. The second wing 142 may have a first end pivotably connected to the driving module 130 and a second end coupled to the second sliding mount 152. The second end of the second wing 142 may be movable on the second sliding mount 152.

A PCB plate 159 may be disposed at the rear of the driving module 130. The PCB plate 159 may be fixed to the rear bracket 130R (see FIG. 2) of the driving module 130. Printed circuit boards (PCBs) may be coupled to the PCB plate 159.

A side cover 200 may form a wall around the sides of the driving module 130. For example, the side cover 200 may be a quadrangular frame. A back cover (not shown) may be coupled to the side cover 200 while covering the driving module 130.

A slide bracket 160 may be coupled or fixed to an end of the wing 141, 142. The slide bracket 160 may include a body 161 having an elongated plate shape and a protrusion 162, 163 formed adjacent to both ends of the body 161. The protrusion 162, 163 may be referred to as a friction protrusion 162, 163 or a contact protrusion 162, 163. For example, the slide bracket 160 may be made of metal.

There may be a plurality of protrusions 162 and 163. The plurality of protrusions 162 and 163 may include a front protrusion 163 and a rear protrusion 162. The front protrusion 163 may be formed at a first corner C1 and/or a fourth corner C4 of the body 161. The front protrusion 163 may protrude by being pressed toward the front of the body 161. The front protrusion 163 may have a dome or hemispherical shape. The rear protrusion 162 may be formed at a second corner C2 and/or a third corner C3 of the body 161. The rear protrusion 162 may protrude by being pressed toward the rear of the body 161. The rear protrusion 162 may have a dome or hemispherical shape. The rear protrusion 162 may be adjacent to the front protrusion 163. The front protrusion 163 and the rear protrusion 162 may be sequentially disposed along a short side of the body 161. One pair of the front protrusion 163 and the rear protrusion 162 may be disposed opposite another pair of the front protrusion 163 and the rear protrusion 162 with respect to the wing 141, 142.

Figure 22:
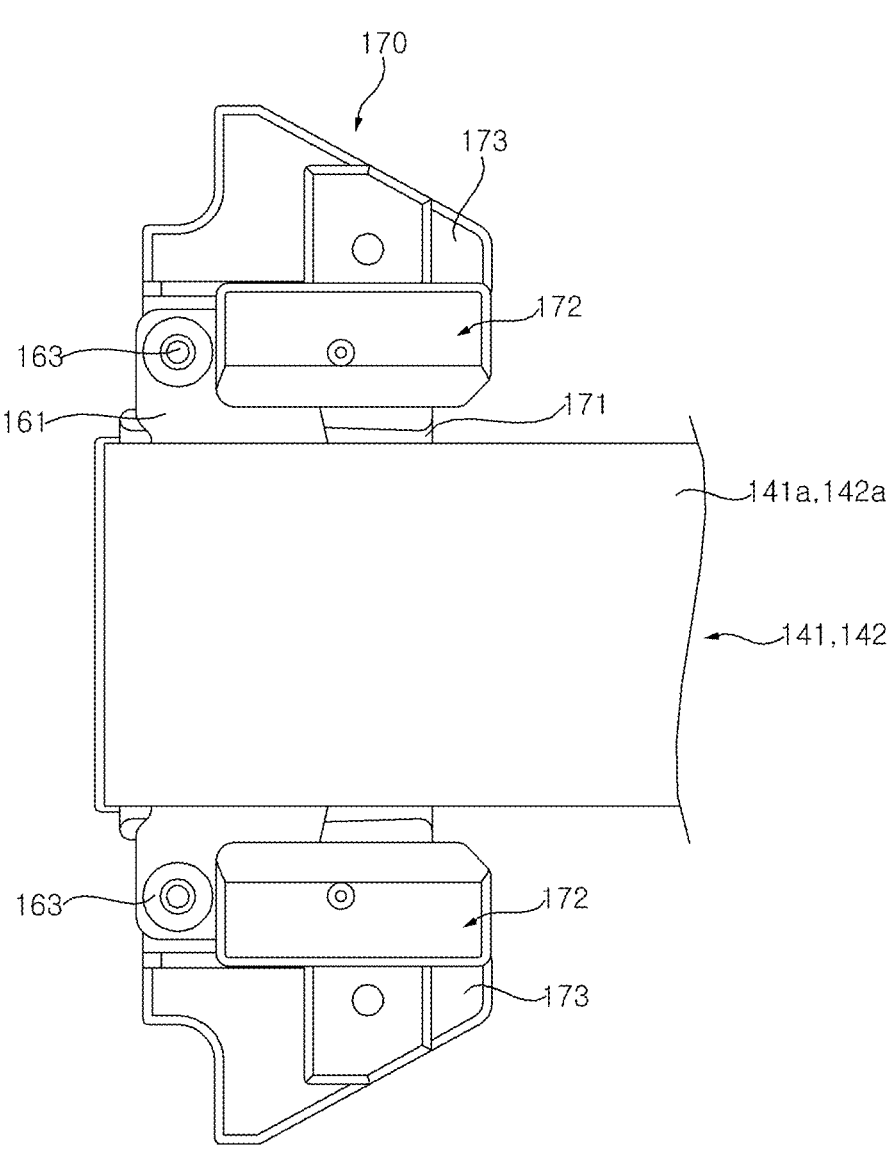
Figure 23:
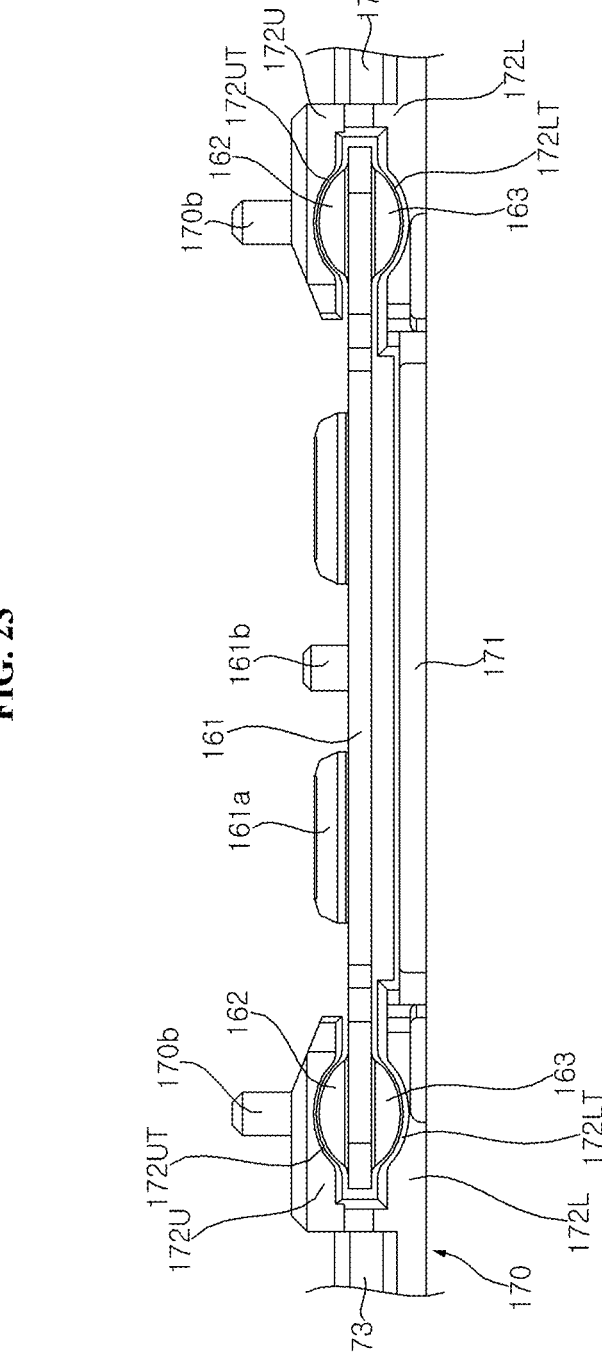

Referring to FIGS. 22 and 23, the slide bracket 160 may be coupled to a guide cover 170. The slide bracket 160 may be inserted into the guide cover 170, and may be movable on the guide cover 170. For example, the guide cover 170 may be made of a synthetic resin with low friction. The guide cover 170 may be made of a low-friction material. For example, the guide cover 170 may be made of POM acetal homopolymer.

The guide cover 170 may include a base 171, a side rail 172, and a fixing plate 173. The base 171 may have an elongated plate shape and may face the slide bracket 160. The side rail 172 may be provided at each of both ends of the base 171. The side rail 172 may include a lower part 172L and an upper part 172U. The lower part 172L may extend from the base 171.

The lower part 172L may be provided with a lower trench 172LT. The lower trench 172LT may be formed in the lower part 172L as an upper surface of the lower part 172L is recessed inward in an elongated manner. For example, the lower trench 172LT may be in the shape of a half pipe. The front protrusion 163 of the slide bracket 160 may be movable on the lower trench 172LT. A radius of curvature of the front protrusion 163 may be less than a radius of curvature of the lower trench 172LT, thereby allowing the front protrusion 163 to make point contact with the lower trench 172LT.

The upper part 172U may be spaced apart from the lower part 172L and may face the lower part 172L. A gap may be formed between the upper part 172U and the lower part 172L, and the slide bracket 160 may be inserted into the gap. The upper part 172U may be provided with an upper trench 172UT. The upper trench 172UT may be formed in the upper part 172U as a lower surface of the upper part 172U is recessed inward in an elongated manner. For example, the upper trench 172UT may be in the shape of a half pipe. The rear protrusion 162 of the slide bracket 160 may be movable on the upper trench 172UT. A radius of curvature of the rear protrusion 162 may be less than a radius of curvature of the upper trench 172UT, thereby allowing the rear protrusion 162 to make point contact with the upper trench 172UT.

As the slide bracket 160 and the guide cover 170 are coupled to each other, it is possible to prevent deflection or sagging of the wing 141, 142 due to self-weight.

The slide bracket 160 may include a coupling portion 161a and a PEM nut 161b or a coupling protrusion 161b for coupling with the wing 141, 142. The guide cover 170 may include a PEM nut 170b or a coupling protrusion 170b for coupling with the sliding mount 151, 152.

Figure 24:
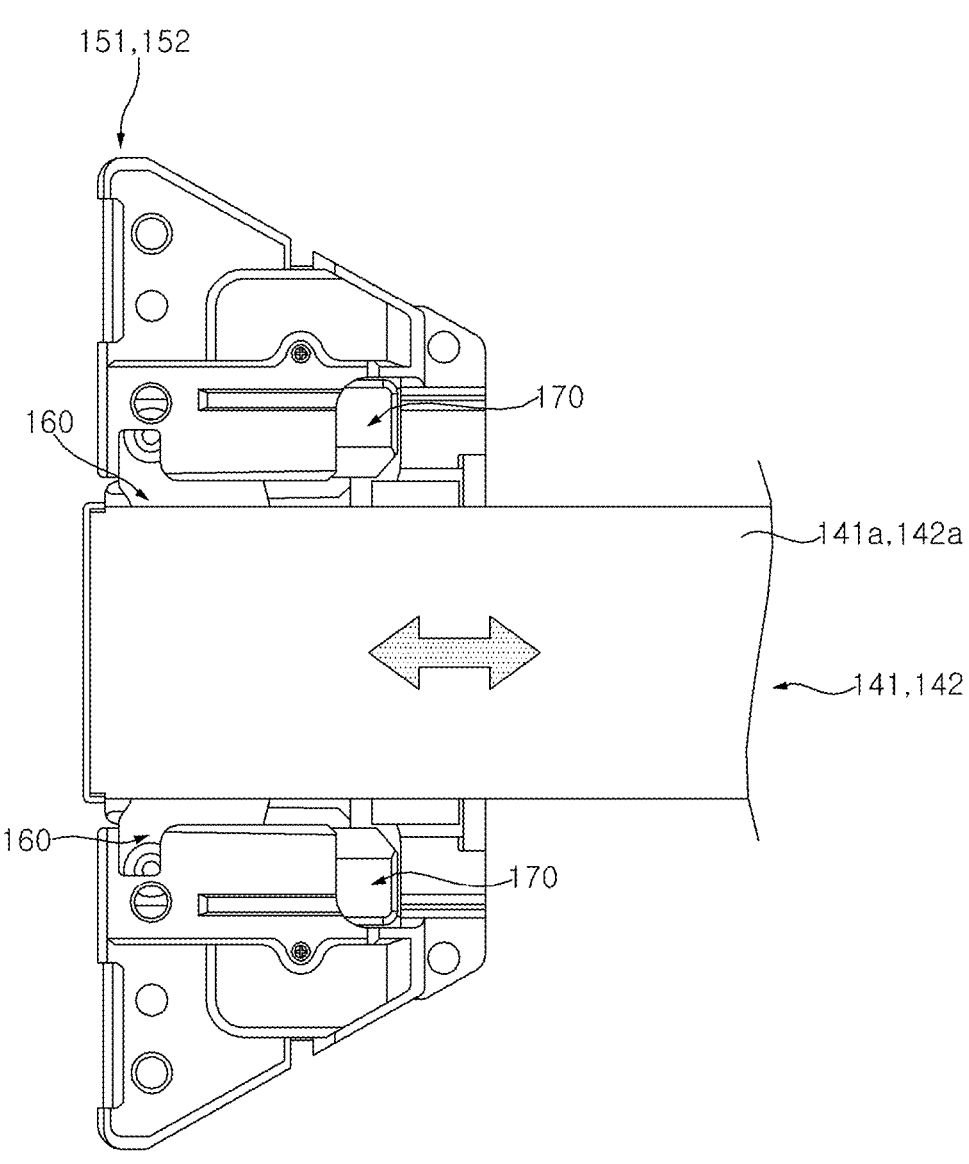
Figure 25:
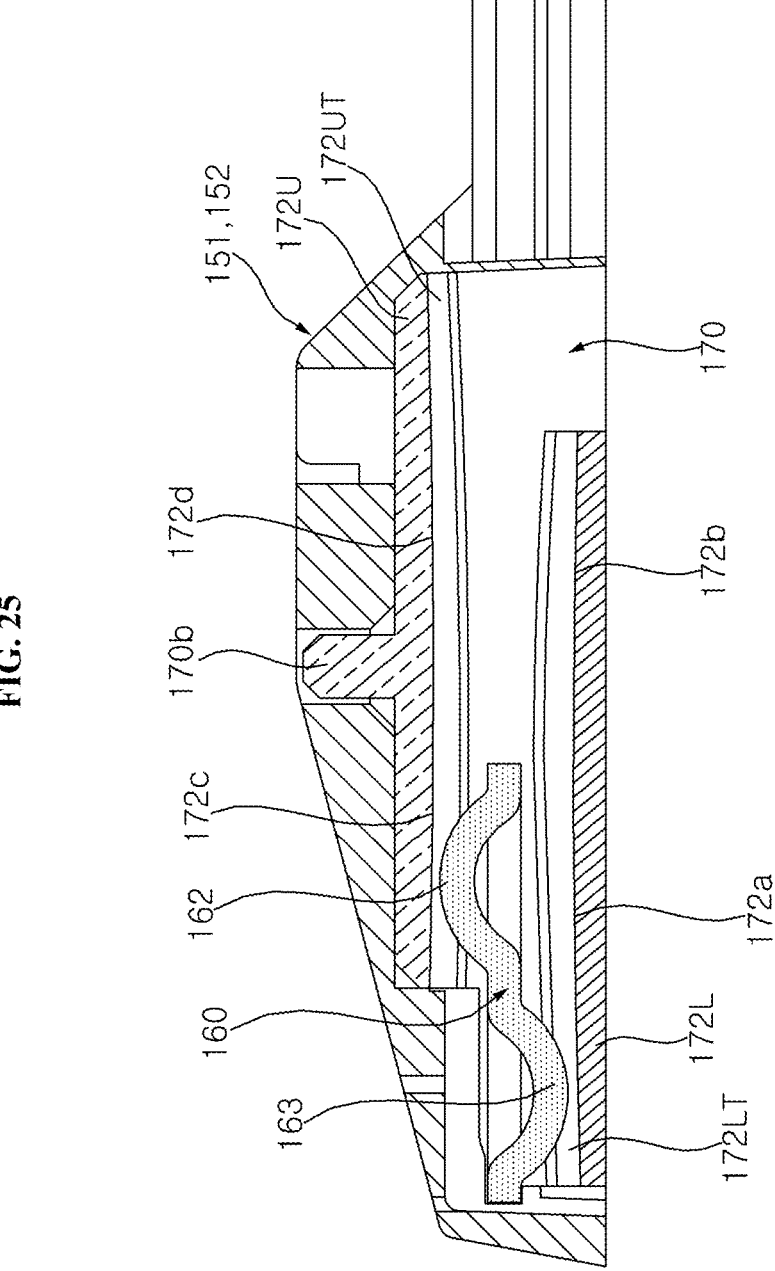
Figure 26:
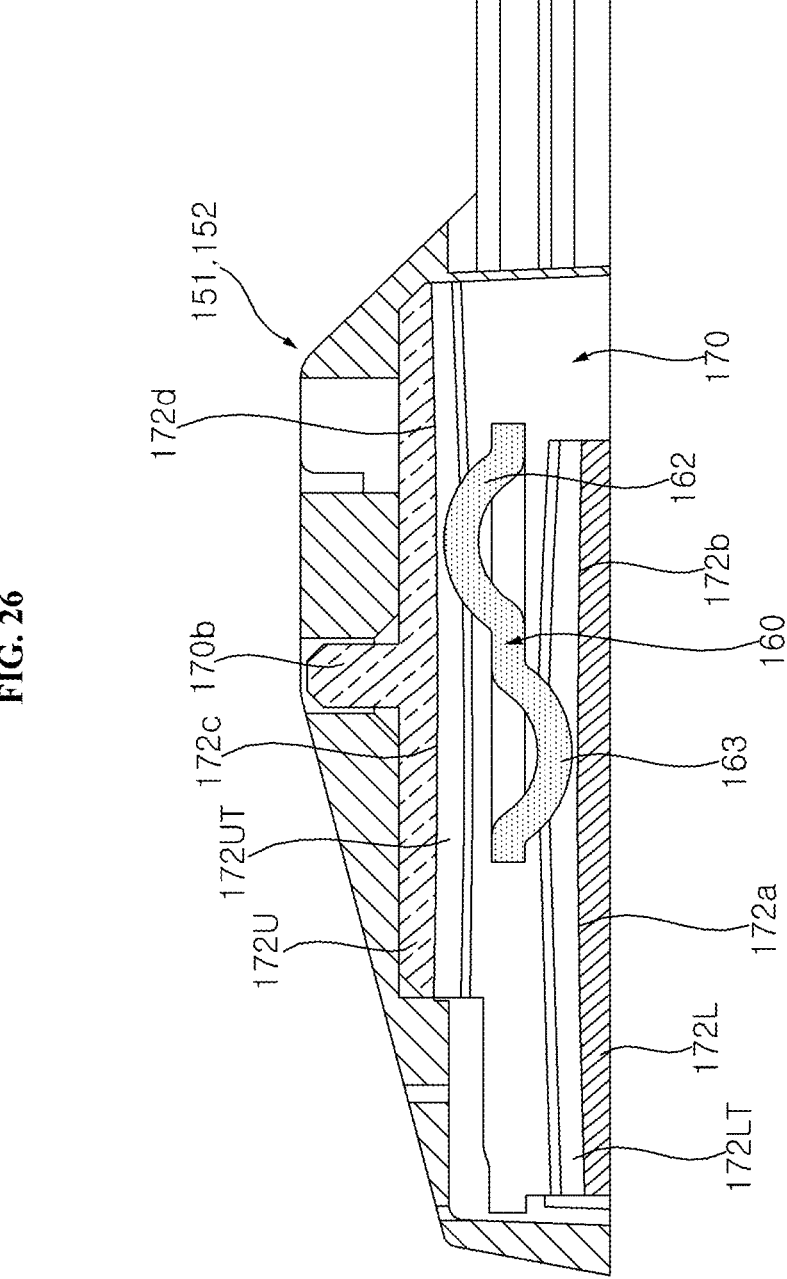

Referring to FIGS. 24 to 26, the slide bracket 160 may be coupled to a front surface of the wing blade 141a, 142b while being adjacent to an end of the wing 141, 142. The guide cover 170 may be fixed to the sliding mount 151, 152. The slide bracket 160 may be inserted into the guide cover 170, and may move on the guide cover 170 while reciprocating in a longitudinal direction of the wing 141, 142.

When the display panel 110 changes from a curved state with a predetermined curvature to a flat state, the slide bracket 160 may move on the guide cover 170 toward the short side SS1, SS2 of the plate 120. The front protrusion 163 may be movable on the lower trench 172LT. The front protrusion 163 may move on the lower trench 172LT while making contact with or gently rubbing against the surface of the lower trench 172LT. The rear protrusion 162 may move on the upper trench 172UT while making contact with or gently rubbing against the surface of the upper trench 172UT.

When the display panel 110 changes from the flat state to the curved state with a predetermined curvature, the slide bracket 160 may move on the guide cover 170 from the short side SS1, SS2 of the plate 120 toward the driving module 130. The front protrusion 163 may be movable on the lower trench 172LT. The front protrusion 163 may move on the lower trench 172LT while making contact with or gently rubbing against the surface of the lower trench 172LT. The rear protrusion 162 may move on the upper trench 172UT while making contact with or gently rubbing against the surface of the upper trench 172UT.

As the protrusion 162, 163 make point contact with the trench 172LT, 172UT, it is possible to reduce friction to thereby reduce abrasion caused by friction. In addition, as no lubricant is required, it is possible to improve structural durability of the mechanism.

Figure 27:
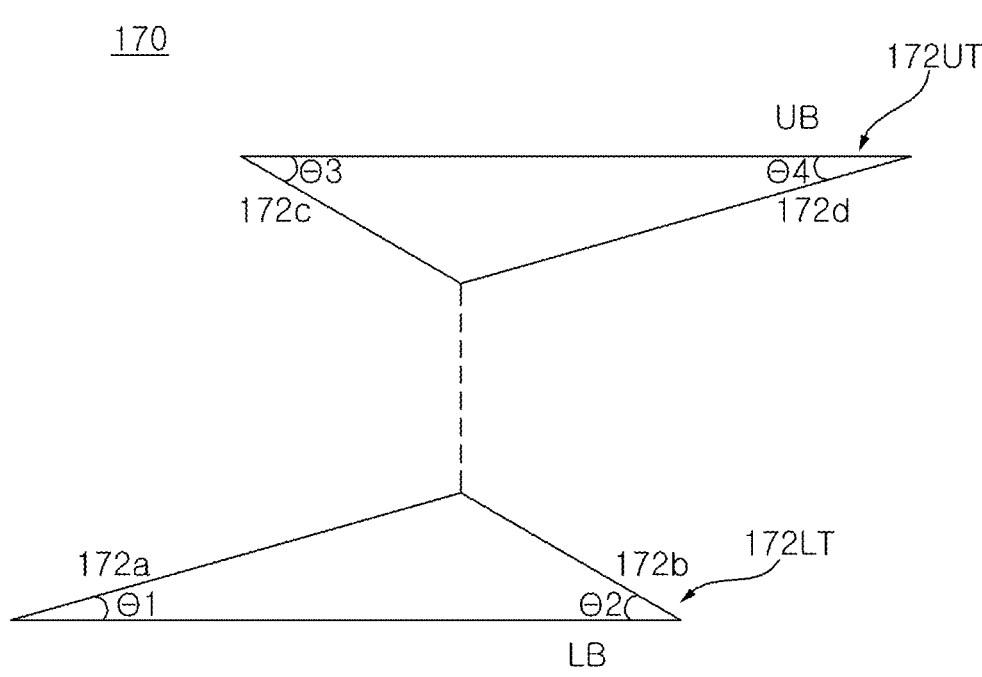

Referring to FIG. 27, the lower trench 172LT may include a first inclined surface 172a and a second inclined surface 172b, and the upper trench 172UT may include a third inclined surface 172c and a fourth inclined surface 172d. The first inclined surface 172a may form a first angle θ1 with respect to a base surface LB. The second inclined surface 172b may form a second angle θ2 with respect to the base surface LB. The second inclined surface 172b may be in contact with the first inclined surface 172a.

The third inclined surface 172c may form a third angle θ3 with respect to a base surface UB. The fourth inclined surface 172d may form a fourth angle θ4 with respect to the base surface UB. The fourth inclined surface 172d may be in contact with the third inclined surface 172c. A boundary between the third inclined surface 172c and the fourth inclined surface 172d may correspond to or be aligned with a boundary between the first inclined surface 172a and the second inclined surface 172b. For example, the boundary between the third inclined surface 172c and the fourth inclined surface 172d and the boundary between the first inclined surface 172a and the second inclined surface 172b may be vertically aligned on the same line.

The second angle θ2 may be greater than the first angle θ1. The third angle θ3 may be greater than the fourth angle θ4. A length of the first inclined surface 172a may be greater than a length of the second inclined surface 172b. A length of the fourth inclined surface 172d may be greater than a length of the third inclined surface 172c. The third inclined surface 172c may face the first inclined surface 172a, and the second inclined surface 172b may face the fourth inclined surface 172d.

Figure 28:
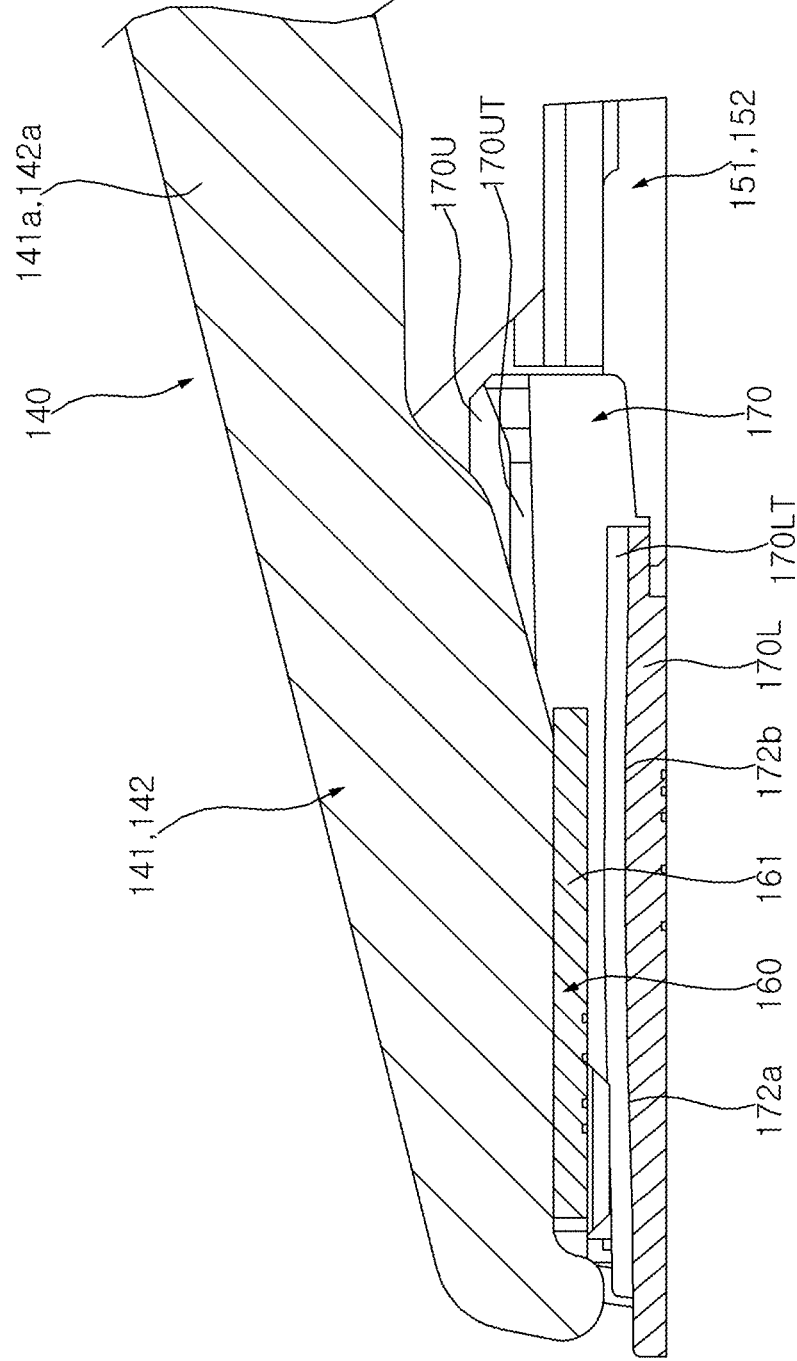

Referring to FIG. 28 along with FIG. 24, the slide bracket 160 to which the wing 140 is coupled may be inserted into or coupled to the guide cover 170 and the sliding mount 151, 152. As the wings 151 and 152 move by pivoting about the driving module 130, the slide bracket 160 may move on the guide cover 170 in a longitudinal direction of the wing 140.

When the wing 140 causes the display panel 110 to change from a flat state to a curved state, the slide bracket 160 may move from the first inclined surface 172a to the second inclined surface 172b. When the wing 140 causes the display panel 110 to change from the curved state with a predetermined curvature to the flat state, the slide bracket 160 may move from the second inclined surface 172b to the first inclined surface 172a.

Referring also to FIG. 25, while the wing 140 causes the display panel 110 to change from the flat state to the curved state, the front protrusion 163 of the slide bracket 160 may slide in contact with the lower trench 172LT. The front protrusion 163 may press and rub against the lower trench 172LT. The rear protrusion 162 may slide in contact with the upper trench 172UT or may slide while being supported by the upper trench 172UT.

While the wing 140 causes the display panel 110 to change from the curved state with a predetermined curvature to the flat state, the front protrusion 163 of the slide bracket 160 may slide in contact with the lower trench 172LT or may slide while being supported by the lower trench 172LT. The rear protrusion 162 may slide in contact with the upper trench 172UT or may slide while being supported by the upper trench 172UT.

Accordingly, when the display panel 110 is curved, the curved curvature of the display panel 110 may become a constant curvature with a predetermined curvature or a curvature close to the constant curvature.

Figure 29:
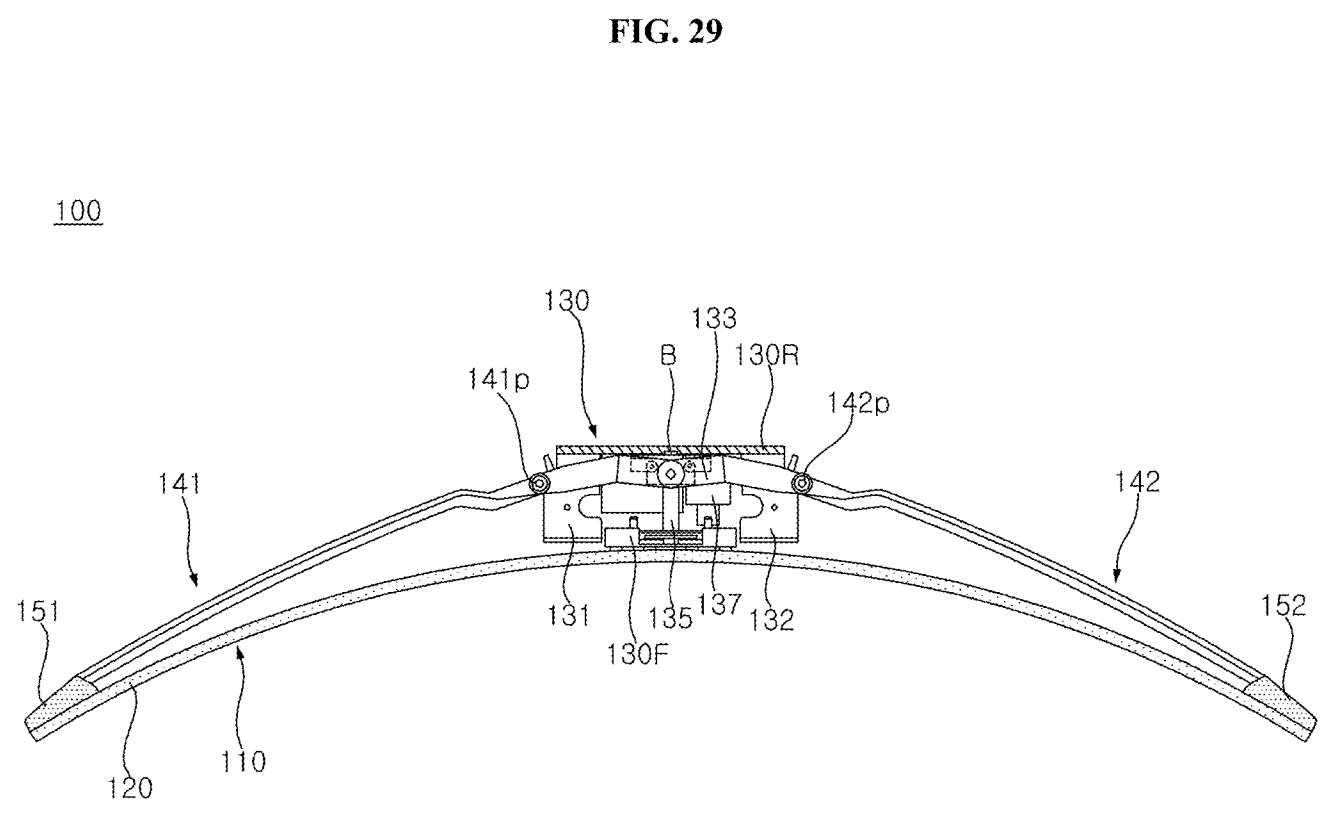

Referring to FIG. 29 along with FIG. 2, as the lead screw 135 is rotated by the torque provided by the motor 137, the flip frame 133 may move in a longitudinal direction of the lead screw 135, causing the wing 140 to pivot about the pivot shaft 141P, 142P.

When the wing 140 pivots, the slide bracket 160 may move on the sliding mount 151, 152 (see FIG. 24) and the guide cover 170 while pushing both short sides of the display panel 110 and the plate 120, causing the display panel 110 to be curved.

When the lead screw 135 is reversely rotated, the flip frame 133 may move in a reverse direction of the lead screw 135, causing the wing 140 to pivot about the pivot shaft 141P, 142P in an opposite direction.

When the wing 140 pivots in the opposite direction, the slide bracket 160 may move on the sliding mount 151, 152 and the guide cover 170 while pulling both short sides of the display panel 110 and the plate 120, causing the display panel 110 to be flat.

Referring to FIGS. 1 to 29, a display device includes: a flexible display panel 110; a flexible plate 120 positioned at a rear of the display panel 110 and to which the display panel 110 is coupled; a driving module 130 positioned at a rear of the plate 120 and including a flip frame 133 configured to linearly reciprocate; a wing 141, 142 elongated with a first end coupled to the flip frame 133 and a second end coupled to the rear of the plate 120, the wing 141, 142 including a pivot shaft 141P, 142P disposed adjacent to the first end between the first end and the second end; and a wing bracket 131, 132 to which the pivot shaft 141P, 142P is connected, the wing bracket 131, 132 being fixed to the rear of the plate 120. The driving module 130 may include: a lead screw 135 configured to be rotatable; a driving gear 136 fixed to the lead screw 135 so as to rotate together with the lead screw 135; a motor 137 configured to provide torque; a gear box 138 configured to transmit the torque provided by the motor 137 to the driving gear 136; and a moving block 134 configured to move on the lead screw 135 by rotation of the lead screw 135. The flip frame 133 may have a first side fixed to the wing 141, 142 and a second side pivotably connected to the moving block 134.

The gear box 138 may include: a worm 138a fixed to a rotating shaft of the motor 137 so as to rotate together with the rotating shaft of the motor 137; a worm gear 138b configured to mesh with the worm 138a; and a transmission gear 138c configured to rotate together with the worm gear 138b and to mesh with the driving gear 136.

The driving module 130 may further include a moving block 134 configured to move on the lead screw 135 by rotation of the lead screw 135. The moving block 134 may include a pivot pin 133c protruding to an outside of the moving block 134 and having a longitudinal direction that intersects a rotating shaft of the lead screw 135. The flip frame 133 may be pivotably connected to the pivot pin 133c.

The moving block 134 may include: a body 134a; and a sliding block 134b press-fitted into the body 134a and screw-coupled to the lead screw 135. A clearance may be formed between the sliding block 134b and the lead screw 135.

The display device may further include a first elastic member 101 disposed between the moving block 134 and the flip frame 133, the first elastic member 101 having a first side fixed to the first end of the wing 141, 142 and a second side in contact with the moving block 134.

The first elastic member 101 may include: a first part 101a fixed to the first end of the wing 141, 142 and having a plate shape; a second part 101b bent and extending from the first part 101a; and a third part 101c bent and extending from the second part 101b, facing the first part 101a, and supporting the moving block 134.

The first elastic member 101 may further include a support rib 101R formed on an outer surface of the third part 101c in a protruding manner and contacting the moving block 134.

The flip frame 133 may include a hole 133H1, 133H2 formed through the flip frame 133. The pivot pin 133c may be inserted into the hole 133H1, 133H2 of the flip frame 133. A clearance may be formed between the pivot pin 133c and the hole 133H1, 133H2.

The moving block 134 may further include an intermediate member 139 that covers an outer circumference of the pivot pin 133c in the clearance, the intermediate member 139 contacting the hole 133H1, 133H2 of the flip frame 133. The intermediate member 139 may be made of a low-friction material.

When the motor 137 rotates in one direction, the flip frame 133 may move forward on the lead screw 135, and when the motor 137 rotates in a direction reverse to the one direction, the flip frame 133 may move backward on the lead screw 135.

The display device may further include a second elastic member 102 having a first side supported by the wing bracket 131, 132 and a second side supported by the wing 141, 142. The second elastic member 102 may push the wing 141, 142 in one of a forward direction and a backward direction of the flip frame 133.

Certain embodiments or other embodiments of the disclosure described above are not mutually exclusive or distinct from each other. Any or all elements of the embodiments of the disclosure described above may be combined or combined with each other in configuration or function.

For example, a configuration "A" described in one embodiment of the disclosure and the drawings, and a configuration "B" described in another embodiment of the disclosure and the drawings may be combined with each other. Namely, although the combination between the configurations is not directly described, the combination is possible except in the case where it is described that the combination is impossible.

The above detailed description is to be construed in all aspects as illustrative and not restrictive. The scope of the present disclosure should be determined by reasonable interpretation of the appended claims, and all changes coming within the equivalency range of the present disclosure are intended to be embraced in the scope of the present disclosure.

The invention claimed is:

1. A display device comprising:
   a flexible display panel;

a flexible plate positioned at a rear of the display panel and to which the display panel is coupled;

a driving module positioned at a rear of the plate and including a flip frame configured to linearly reciprocate;

a wing elongated with a first end coupled to the flip frame and a second end coupled to the rear of the plate, the wing including a pivot shaft disposed adjacent to the first end between the first end and the second end; and a wing bracket to which the pivot shaft is connected, the wing bracket being fixed to the rear of the plate, wherein the driving module comprises:

a lead screw configured to be rotatable;

a driving gear fixed to the lead screw so as to rotate together with the lead screw;

a motor configured to provide torque;

a gear box configured to transmit the torque provided by the motor to the driving gear; and a moving block configured to move on the lead screw by rotation of the lead screw, and wherein the flip frame has a first side fixed to the wing and a second side pivotably connected to the moving block.

2. The display device of claim 1, wherein the gear box comprises:

a worm fixed to a rotating shaft of the motor so as to rotate together with the rotating shaft of the motor;

a worm gear configured to mesh with the worm; and a transmission gear configured to rotate together with the worm gear and to mesh with the driving gear.

3. The display device of claim 2, wherein the driving module further comprises a moving block configured to move on the lead screw by rotation of the lead screw, wherein the moving block includes a pivot pin protruding to an outside of the moving block, the pivot pin having a longitudinal direction that intersects a rotating shaft of the lead screw, and wherein the flip frame is pivotably connected to the pivot pin.

4. The display device of claim 3, wherein the moving block comprises:

a body; and a sliding block press-fitted into the body and screw-coupled to the lead screw, and wherein a clearance is formed between the sliding block and the lead screw.

5. The display device of claim 4, further comprising a first elastic member disposed between the moving block and the flip frame, the first elastic member having a first side fixed to the first end of the wing and a second side in contact with the moving block.

6. The display device of claim 5, wherein the first elastic member comprises:

a first part fixed to the first end of the wing and having a plate shape;

a second part bent and extending from the first part; and a third part bent and extending from the second part, facing the first part, and supporting the moving block.

7. The display device of claim 6, wherein the first elastic member further comprises a support rib formed on an outer surface of the third part in a protruding manner, the support rib contacting the moving block.

8. The display device of claim 3, further comprising a first elastic member disposed between the moving block and the flip frame, the first elastic member having a first side fixed to the first end of the wing and a second side in contact with the moving block.

9. The display device of claim 8, wherein the flip frame includes a hole formed through the flip frame, wherein the pivot pin is inserted into the hole of the flip frame, and wherein a clearance is formed between the pivot pin and the hole.

10. The display device of claim 9, wherein the moving block further includes an intermediate member that covers an outer circumference of the pivot pin in the clearance, the intermediate member contacting the hole of the flip frame, and wherein the intermediate member is made of a low-friction material.

11. The display device of claim 8, wherein the first elastic member comprises:

a first part fixed to the first end of the wing and having a plate shape;

a second part bent and extending from the first part; and a third part bent and extending from the second part, facing the first part, and supporting the moving block.

12. The display device of claim 11, wherein the first elastic member further comprises a support rib formed on an outer surface of the third part in a protruding manner, the support rib contacting the moving block.

13. The display device of claim 1, wherein when the motor rotates in one direction, the flip frame moves forward on the lead screw, and when the motor rotates in a direction reverse to the one direction, the flip frame moves backward on the lead screw.

14. The display device of claim 13, further comprising a second elastic member having a first side supported by the wing bracket and a second side supported by the wing, wherein the second elastic member pushes the wing in one of a forward direction and a backward direction of the flip frame.

* * * * *